(12) United States Patent
Kimura et al.

(10) Patent No.: US 12,429,333 B2
(45) Date of Patent: Sep. 30, 2025

(54) SPECIMEN MACHINING DEVICE AND SPECIMEN MACHINING METHOD

(71) Applicant: JEOL Ltd., Tokyo (JP)

(72) Inventors: Tatsuhito Kimura, Tokyo (JP); Munehiro Kozuka, Tokyo (JP); Naoki Sugano, Tokyo (JP)

(73) Assignee: JEOL Ltd., Tokyo (JP)

( * ) Notice: Subject to any disclaimer, the term of this patent is extended or adjusted under 35 U.S.C. 154(b) by 628 days.

(21) Appl. No.: 17/865,850

(22) Filed: Jul. 15, 2022

(65) Prior Publication Data

US 2023/0015109 A1 Jan. 19, 2023

(30) Foreign Application Priority Data

Jul. 16, 2021 (JP) .................................. 2021-117757

(51) Int. Cl.
*G02B 21/06* (2006.01)
*G01B 21/06* (2006.01)
(Continued)

(52) U.S. Cl.
CPC .............. *G01B 21/06* (2013.01); *G02B 21/18* (2013.01); *G02B 21/26* (2013.01)

(58) Field of Classification Search
CPC ........ G01B 21/06; G02B 21/18; G02B 21/26; G01N 1/286; G01N 1/32; H01J 37/3045;
(Continued)

(56) References Cited

U.S. PATENT DOCUMENTS

2006/0255295 A1* 11/2006 Yoshioka ................. G01N 1/32
250/492.21
2008/0283746 A1* 11/2008 Ohnishi ................... H01J 37/26
250/307

(Continued)

FOREIGN PATENT DOCUMENTS

| JP | 200021851 A | 1/2000 |
|---|---|---|
| JP | 201054409 A | 3/2010 |
| JP | 2012193962 A | 10/2012 |

OTHER PUBLICATIONS

Partial European Search Report issued in EP22184620.7 on Dec. 8, 2022.
Office Action issued in JP2021117757 on May 2, 2023.

*Primary Examiner* — Mustak Choudhury
(74) *Attorney, Agent, or Firm* — The Webb Law Firm

(57) ABSTRACT

A specimen machining device includes an illumination system that illuminates a specimen; a camera that photographs the specimen; and a processing unit that controls the illumination system and the camera, and acquires a machining control image which is used for controlling an ion source and a display image which is displayed on a display unit. The processing unit controls the illumination system to illuminate the specimen under a machining illumination condition; acquires the machining control image by controlling the camera to photograph the specimen illuminated under the machining control illumination condition; controls the ion source based on the machining control image; controls the illumination system to illuminate the specimen under a display illumination condition which is different from the machining control illumination condition; acquires the display image by controlling the camera to photograph the specimen illuminated under the display illumination condition; and displays the display image on the display unit.

15 Claims, 24 Drawing Sheets

(51) Int. Cl.
*G01N 1/02* (2006.01)
*G02B 21/18* (2006.01)
*G02B 21/26* (2006.01)

(58) Field of Classification Search
CPC ..... H01J 2237/20207; H01J 2237/2482; H01J 2237/3114
See application file for complete search history.

(56) References Cited

U.S. PATENT DOCUMENTS

| | | | |
|---|---|---|---|
| 2011/0052044 A1* | 3/2011 | Takahashi | G01N 23/2255 382/154 |
| 2011/0063431 A1* | 3/2011 | Kiyohara | G01N 23/2255 382/145 |
| 2012/0001069 A1* | 1/2012 | Kashihara | H01J 37/28 250/310 |
| 2014/0028828 A1* | 1/2014 | Hunt | G01N 1/32 348/79 |

* cited by examiner

SPECIMEN MACHINING DEVICE AND SPECIMEN MACHINING METHOD

CROSS REFERENCE TO RELATED APPLICATION

This application claims priority to Japanese Patent Application No. 2021-117757, filed on Jul. 16, 2021, the disclosure of which is hereby incorporated by reference in its entirety.

BACKGROUND OF THE INVENTION

Field of the Invention

The present invention relates to a specimen machining device and a specimen machining method.

Description of Related Art

As a specimen machining device that machines a specimen using an ion beam, the Cross-Section Polisher® for machining the cross-section of a specimen, the Ion Slicer® for preparing a thin film specimen, and the like are known.

For example, JP-A-2012-193962 discloses a specimen machining device that disposes a shielding belt on a bulk specimen, irradiates the specimen with an ion beam via the shielding belt, and performs ion milling on a portion which is not shielded by the shielding belt, so as to prepare a thin film specimen for a transmission electron microscope.

In the case of JP-A-2012-193962, an image of an etching cross-section of the specimen is photographed by a CCD camera, and a change in the form of the specimen is monitored by an ion milling end determination circuit. When the ion milling end determination circuit detects that a through hole has been opened in the specimen, emission of the ion beam is stopped.

In the above mentioned specimen machining device, the change in the form of the specimen is monitored using the images photographed by the camera. Since images photographed under the same conditions are necessary, the images of the specimen are photographed by the camera under the same illumination conditions.

However, if a specimen image photographed under illumination conditions, which are different from the illumination conditions used for the ion milling end determination, can be acquired, a user can more easily check the machining state. For example, the user can accurately recognize the machining state by setting illumination conditions under which the machining edge can more easily be checked, or by setting conditions under which the thickness of the specimen can more easily be checked.

SUMMARY OF THE INVENTION

According to a first aspect of the invention, there is provided a specimen machining device for machining a specimen by irradiating the specimen with an ion beam, the device including:
  an ion source that irradiates the specimen with the ion beam;
  a specimen stage that holds the specimen;
  an illumination system including a first illumination device and a second illumination device that illuminate the specimen from directions different from each other;
  a camera that photographs the specimen;
  a display unit on which an image of the specimen photographed by the camera is displayed; and
  a processing unit that controls the illumination system and the camera, and acquires a machining control image that is used for controlling the ion source, and a display image that is displayed on the display unit,
  the processing unit performing processing for:
  controlling the illumination system to illuminate the specimen under a machining control illumination condition;
  acquiring the machining control image by controlling the camera to photograph the specimen illuminated under the machining control illumination condition;
  controlling the ion source based on the machining control image;
  controlling the illumination system to illuminate the specimen under a display illumination condition that is different from the machining control illumination condition;
  acquiring the display image by controlling the camera to photograph the specimen illuminated under the display illumination condition; and
  displaying the display image on the display unit.

According to a second aspect of the invention, there is provided a specimen machining method using a specimen machining device that includes an ion source for irradiating a specimen with an ion beam, and an illumination system having a first illumination device and a second illumination device for illuminating the specimen from directions different from each other, and machines the specimen by irradiating the specimen with the ion beam, the method including:
  controlling the illumination system to illuminate the specimen under a machining control illumination condition;
  acquiring a machining control image by photographing the specimen illuminated under the machining control illumination condition with a camera;
  controlling the ion source based on the machining control image;
  controlling the illumination system to illuminate the specimen under a display illumination condition that is different from the machining control illumination condition;
  acquiring a display image by photographing the specimen illuminated under the display illumination condition with the camera; and
  displaying the display image on a display unit.

DESCRIPTION OF THE INVENTION

Figure 1:
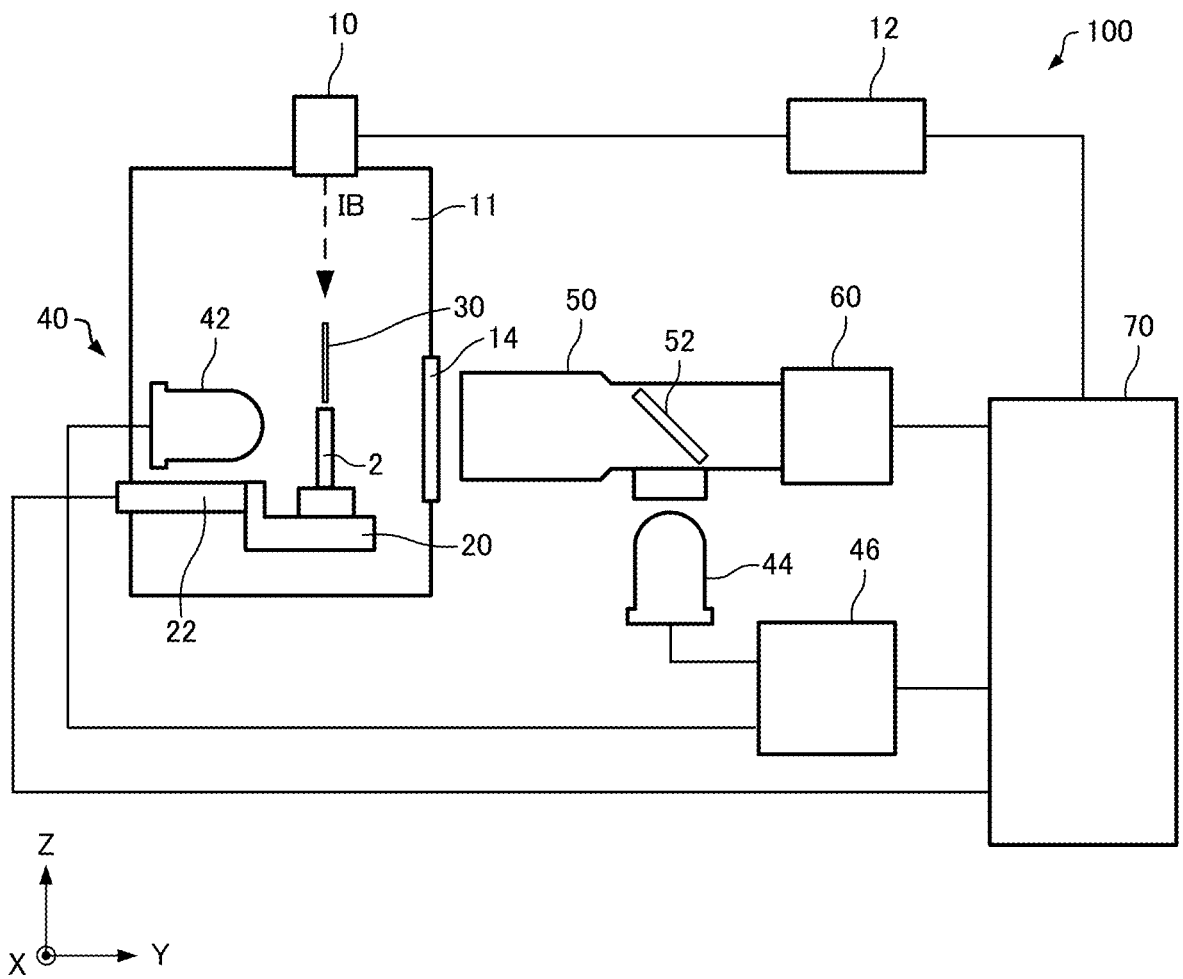
FIG. 1 is a diagram illustrating a configuration of a specimen machining device according to an embodiment of the invention.

According to an embodiment of the invention, there is provided a specimen machining device for machining a specimen by irradiating the specimen with an ion beam, the device including:
an ion source that irradiates the specimen with the ion beam;
a specimen stage that holds the specimen;
an illumination system including a first illumination device and a second illumination device that illuminate the specimen from directions different from each other;
a camera that photographs the specimen;
a display unit on which an image of the specimen photographed by the camera is displayed; and
a processing unit that controls the illumination system and the camera, and acquires a machining control image that is used for controlling the ion source, and a display image that is displayed on the display unit,
the processing unit performing processing for:
controlling the illumination system to illuminate the specimen under a machining control illumination condition;
acquiring the machining control image by controlling the camera to photograph the specimen illuminated under the machining control illumination condition;
controlling the ion source based on the machining control image;
controlling the illumination system to illuminate the specimen under a display illumination condition that is different from the machining control illumination condition;
acquiring the display image by controlling the camera to photograph the specimen illuminated under the display illumination condition; and
displaying the display image on the display unit.

According to this specimen machining device, the machining control image and the display image can be photographed under different illumination conditions. Therefore an image suitable for the machining control image and an image suitable for the display image can be acquired. As a result, machining can be performed accurately by appropriately controlling the ion source using the machining control image, and the display image can be displayed on the display unit, whereby the user can accurately recognize the machining state.

According to an embodiment of the invention, there is provided a specimen machining method using a specimen machining device that includes an ion source for irradiating a specimen with an ion beam, and an illumination system having a first illumination device and a second illumination device for illuminating the specimen from directions different from each other, and machines the specimen by irradiating the specimen with the ion beam, the method including:
controlling the illumination system to illuminate the specimen under a machining control illumination condition;
acquiring a machining control image by photographing the specimen illuminated under the machining control illumination condition with a camera;
controlling the ion source based on the machining control image;
controlling the illumination system to illuminate the specimen under a display illumination condition that is different from the machining control illumination condition;
acquiring s display image by photographing the specimen illuminated under the display illumination condition with the camera; and
displaying the display image on a display unit.

According to this specimen machining method, the machining control image and the display image can be photographed under different illumination conditions. Therefore an image suitable for the machining control image and an image suitable for the display image can be acquired. As a result, machining can be performed accurately by appropriately controlling the ion source using the machining control image, and the display image can be displayed on the display unit, whereby the user can accurately recognize the machining state.

Preferred embodiments of the invention will be described in detail with reference to the drawings. The embodiments described below do not unduly limit the scope of the invention as stated in the claims. Further, all of the components described below are not necessarily essential requirements of the invention.

1. Specimen Machining Device

A specimen machining device according to an embodiment of the invention will be described first with reference to the drawings. FIG. 1 is a diagram illustrating a configuration of the specimen machining device 100 according to an embodiment of the invention. In FIG. 1, three axes (X axis, Y axis, Z axis) which are orthogonal to each other are indicated.

The specimen machining device 100 is a device to machine a specimen 2 by irradiating the specimen 2 with an ion beam IB, so as to prepare a specimen for observation and analysis. The specimen machining device 100 can prepare a thin film specimen that can be observed by a transmission electron microscope.

As illustrated in FIG. 1, the specimen machining device 100 includes an ion source 10, a control circuit 12, a specimen stage 20, a shielding member 30, an illumination system 40, an optical system 50, a camera 60 and an information processing device 70.

The ion source 10 irradiates the specimen 2 with the ion beam IB. The ion source 10 is mounted on top of a chamber 11, and irradiates the specimen 2 housed in the chamber 11 with the ion beam IB. The inside of the chamber 11 is in a vacuum state, for example.

The ion source 10 is an ion gun that accelerates ions at a predetermined acceleration voltage, and emits the ion beam IB. The ion source 10 emits the ion beam IB along the Z axis. The ion source 10 oscillates with an axis parallel to the X axis as a rotation axis when the ion beam IB irradiates the specimen 2. The ion source 10 is controlled by the control circuit 12.

The specimen stage 20 holds the specimen 2. The shielding member 30 is installed on the specimen stage 20. The shielding member 30 is disposed on the specimen 2. The thickness of the shielding member 30 is about 10 μm, for example, and the thickness of the specimen 2 before being machined is about 100 μm, for example. The shielding member 30 is disposed at the center of the specimen 2 in the thickness direction.

The specimen stage 20 includes a swing mechanism 22 that oscillates the specimen 2 and the shielding member 30. The swing mechanism 22 tilts the specimen 2 and the shielding member 30 with the swing axis (tilt axis) as the rotation axis. The swing axis is parallel with the Y axis, for example. The swing mechanism 22 oscillates the specimen 2 and the shielding member 30 at a predetermined cycle, for example.

The specimen 2, which is held by the specimen stage 20, is plate-shaped. For example, the specimen 2 has a rectangular parallelepiped shape. The specimen 2 will be described in detail later.

The shielding member 30 shields the ion beam IB. The ion beam IB emitted from the ion source 10 irradiates the specimen 2 via the shielding member 30. The shielding member 30 is belt-shaped, for example. The shielding member 30 is a shielding belt, for example. The shielding member 30 is formed of a material which is not easily milled by the ion beam IB. The shielding member 30 is positioned above the specimen 2 (+Z direction).

The illumination system 40 illuminates the specimen 2. In the specimen machining device 100, the specimen 2 being machined is illuminated with the illumination system 40, and is imaged by the camera 60. The illumination system 40 includes a plurality of illumination devices that illuminate the specimen 2 from directions which are different from each other. In the case of the example in FIG. 1, the illumination system 40 includes a transmission illumination device 42 and a coaxial illumination device 44.

The transmission illumination device 42 emits the illumination light to perform transmission illumination on the specimen 2. In the case of the transmission illumination, the specimen 2 is illuminated from behind the specimen 2, that is, from the opposite side of the camera 60. Therefore the transmission illumination device 42 emits the illumination light to the specimen 2 from behind. The intensity (luminance) of the illumination light emitted by the transmission illumination device 42 is controlled by an illumination light control circuit 46.

The transmission illumination device 42, the specimen 2, the optical system 50 and the camera 60 are disposed in this sequence along the Y axis.

The coaxial illumination device 44 emits the illumination light to perform coaxial illumination on the specimen 2. In the case of the coaxial illumination, the specimen 2 is illuminated from the same direction as the optical axis of the camera 60 (optical system 50). Therefore the coaxial illumination device 44 emits the illumination light to the specimen 2 along the optical axis of the camera 60. In the example in FIG. 1, the optical system 50 has a half mirror 52, and aligns the optical axis of the illumination light with the optical axis of the camera 60 using the half mirror 52. The intensity of the illumination light emitted by the coaxial illumination device 44 is controlled by the illumination light control circuit 46.

The camera 60 photographs the specimen 2 and the shielding member 30 using the optical system 50. The camera 60 is a digital camera (e.g. CCD camera, CMOS camera). The optical system 50 is an optical system for the camera 60 to photograph the specimen 2. The camera 60 is disposed outside the chamber 11, and photographs the specimen 2 via a window 14 formed in the chamber 11.

The information processing device 70 acquires an image photographed by the camera 60, and controls the machining based on this image. The information processing device 70 also displays the image photographed by the camera 60 on the display unit.

Figure 2:
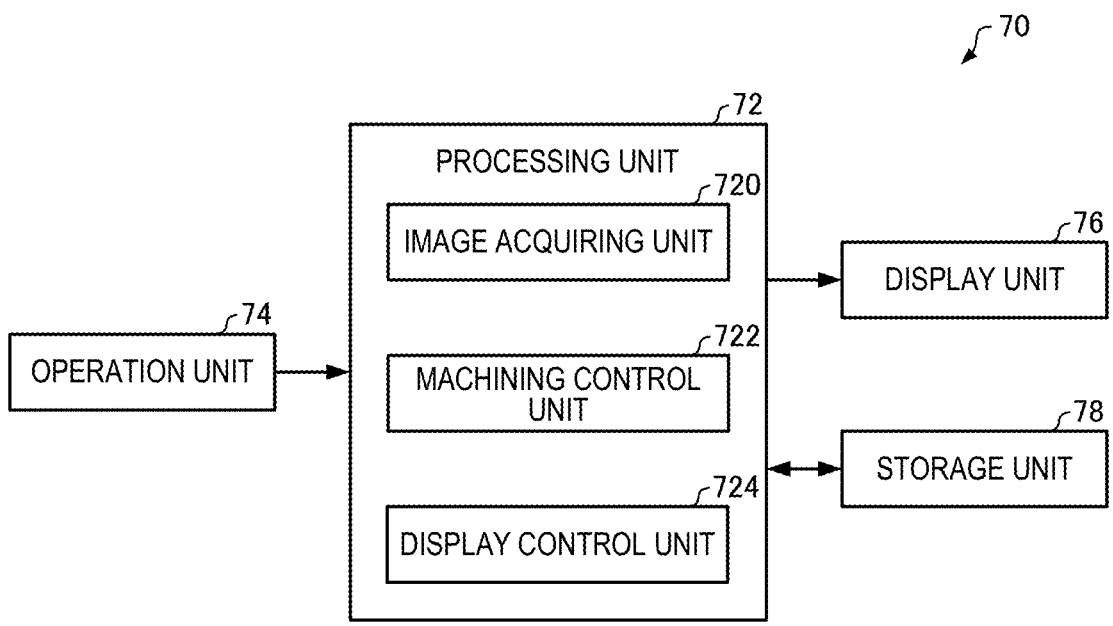
FIG. 2 is a diagram illustrating a configuration of an information processing device.

FIG. 2 is a diagram illustrating a configuration of the information processing device 70.

The information processing device 70 includes a processing unit 72, an operation unit 74, a display unit 76 and a storage unit 78, for example.

The operation unit 74 is for the user to input operation information, and outputs the inputted operation information to the processing unit 72. The functions of the operation unit 74 can be implemented by such hardware as a keyboard, a mouse, buttons, a touch panel and a touch pad.

The display unit 76 displays an image generated by the processing unit 72. The functions of the display unit 76 can be implemented by an LCD, CRT, touch panel which also functions as an operation unit 74, or the like.

The storage unit 78 stores programs and various data for the computer to function as each component of the processing unit 72. The storage unit 78 also functions as a work area of the processing unit 72. The functions of the storage unit 78 can be implemented by a hard disk, a random access memory (RAM) or the like.

The functions of the processing unit 72 can be implemented by hardware, such as various processors (e.g. central processing unit (CPU), digital signal processor (DSP))

executing programs. The processing unit 72 includes an image acquiring unit 720, a machining control unit 722 and a display control unit 724.

The image acquiring unit 720 acquires a machining control image that is used for control of the ion source 10, and a display image that is displayed on the display unit 76. The machining control image is an image of the specimen that the machining control unit 722 uses to determine the end of the machining. The display image is an image for the user to check the machining state. The machining control image and the display image are acquired by photographing the specimen 2 with the camera 60.

The machining control unit 722 controls the ion source 10 based on the machining control image. For example, the machining control unit 722 determines the end of the machining based on the machining control image.

The display control unit 724 displays the display image on the display unit 76.

2. Operation of Specimen Machining Device

The specimen machining device 100 can prepare a specimen by a two-stage milling method that prepares a specimen to be observed from the cross-sectional direction. Further, the specimen machining device 100 can prepare a specimen by a bulk machining method that machines a bulk specimen. In the following, the two-stage milling method and the bulk machining method will be described.

2.1. Two-Stage Milling Method

The two-stage milling method is a method for preparing a specimen that is used for observing a thin film formed on a substrate, a multi-layered film where wires and transistors are formed on a substrate, and the like from the cross-sectional direction. In the two-stage milling method, a primary milling is performed for thinning the specimen in general and a secondary milling is performed for thinning an observation target thin film or multi-layered film down to a thickness that makes observation by the transmission electron microscope possible.

2.1.1. Primary Milling

Figure 3:
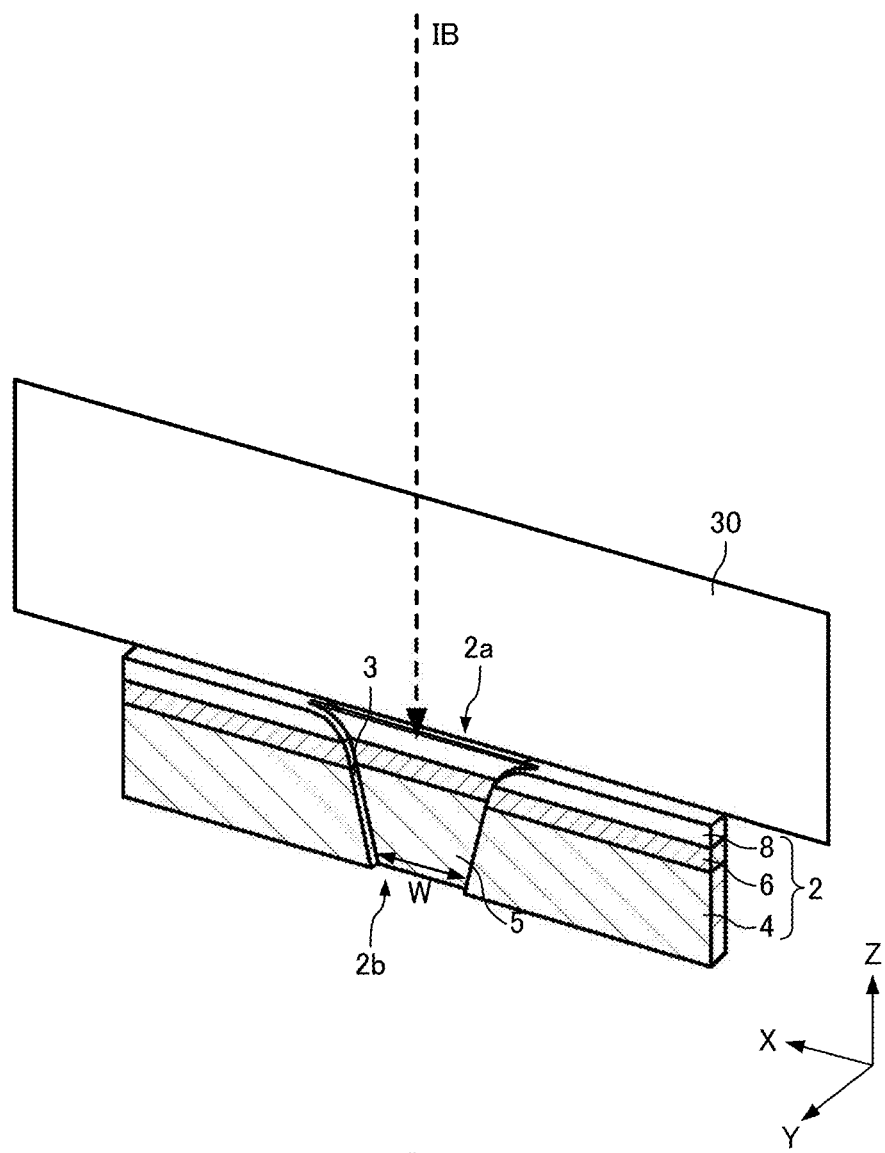
FIG. 3 is a diagram for explaining primary milling.
Figure 4:
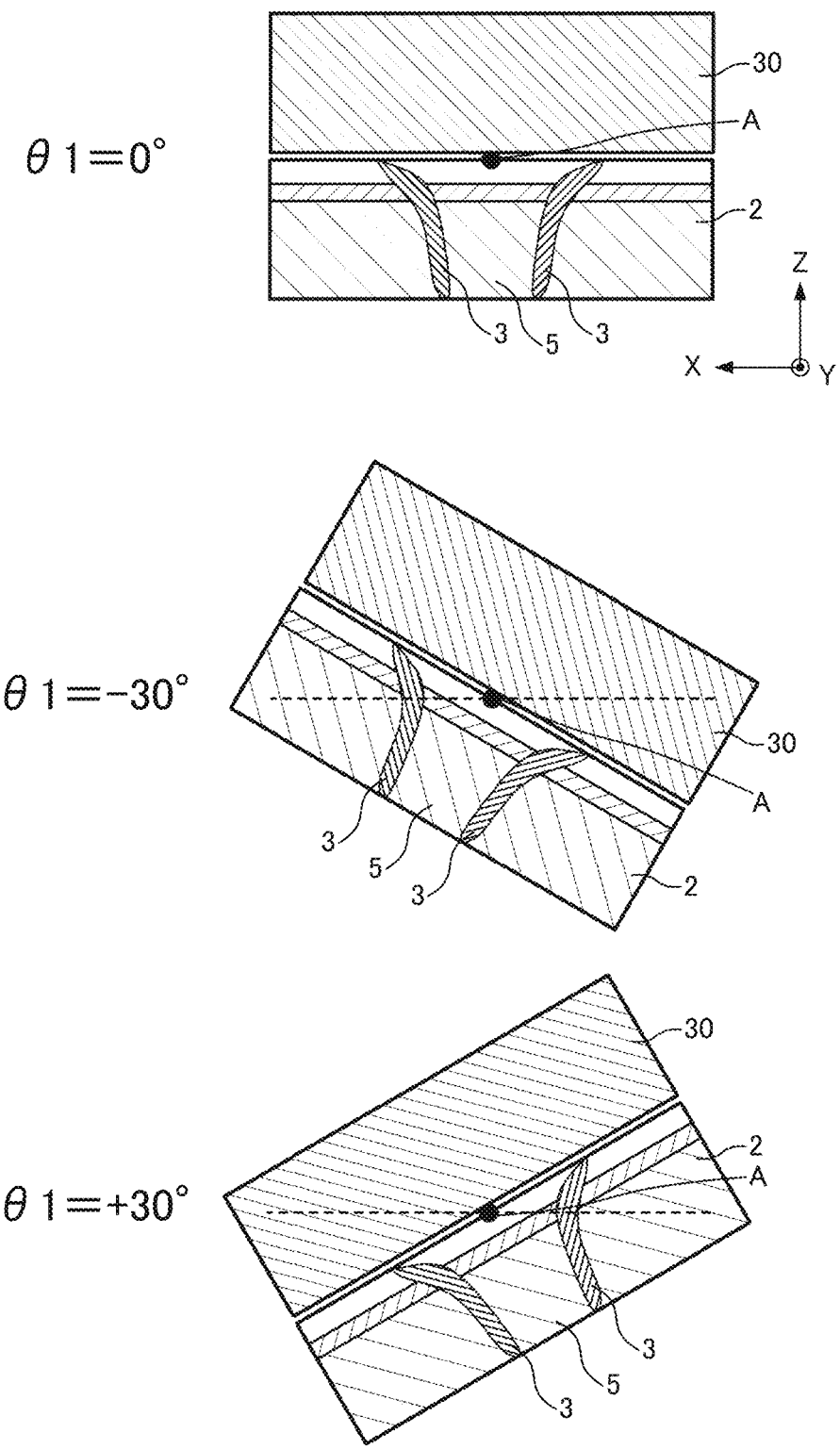
FIG. 4 is a diagram for explaining primary milling.
Figure 5:
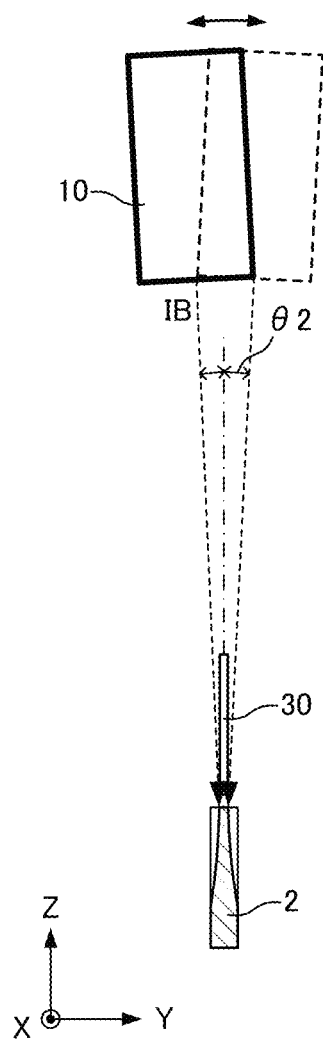
FIG. 5 is a diagram for explaining primary milling.

FIG. 3 to FIG. 5 are diagrams for explaining the primary milling. FIG. 3 is a schematic perspective view of the specimen 2 and the shielding member 30. FIG. 4 is a diagram for explaining the oscillating operation of the specimen 2. FIG. 5 is a diagram for explaining the operation by the ion source 10.

As illustrated in FIG. 3, the specimen 2 includes a substrate 4, a multi-layered film 6 and a protective member 8. The substrate 4 is a semiconductor substrate, such as a silicon substrate and a compound substrate. The multi-layered film 6 includes wiring, transistors and the like formed on the substrate 4 by a semiconductor fabrication technique, for example. In the case of the example in FIG. 3, a specimen for a transmission electron microscope, to observe the cross-section of the multi-layered film 6 formed on the substrate 4, can be prepared. The protective member 8 is a member for protecting the multi-layered film 6 during machining, and is a glass substrate, for example. The protective member 8 adheres to the multi-layered film 6 using epoxy resin or the like. The thickness of the protective member 8 is about 100 μm, for example.

The specimen 2 is machined to be plate-shaped in advance, of which height (dimension in the Z direction) is 500 μm to 800 μm, and width (dimension in the Y direction) is about 100 μm.

The configuration of the specimen 2 is not limited to the example in FIG. 3, and specimens having various configurations can be machined using the two-stage milling method, so as to be observable by the transmission electron microscope.

In the primary milling, the specimen 2 is positioned such that a first edge 2a of the specimen 2 is at the top, and a second edge 2b of the specimen 2 is at the bottom. The first edge 2a of the specimen 2 is an edge of the specimen 2 on the protective member 8 side, and the second edge 2b of the specimen 2 is an edge of the specimen 2 on the substrate 4 side. The specimen 2 is disposed under the shielding member 30, and the ion beam IB irradiates the specimen 2 from the first edge 2a side. The ion beam IB irradiates the specimen 2 via the shielding member 30.

When the ion beam IB irradiates the specimen 2 for machining, a swing mechanism 22 of the specimen stage 20 is operated, as illustrated in FIG. 4, so as to oscillate the specimen 2 and the shielding member 30 with an axis A as the rotation axis. In other words, the swing mechanism 22 tilts (rotates) the specimen 2 and the shielding member 30 backward and forward with the axis A as the tilt axis (rotation axis). The axis A is an axis that is parallel with the Y axis, for example. The axis A is located at the boundary between the specimen 2 and the shielding member 30, for example.

In FIG. 4, the "+" tilt angle $\theta 1$ indicates the counterclockwise direction, and "−" tilt angle $\theta 1$ indicates the clockwise direction from $\theta 1=0°$, which is the state where the specimen 2 is parallel with the X axis. FIG. 4 illustrates the states when the tilt angle $\theta 1$ of the specimen 2 is 0°, when the tilt angle $\theta 1$ of the specimen 2 is −30°, and when the tilt angle $\theta 1$ of the specimen 2 is +30°.

As illustrated in FIG. 5, the ion source 10 is also oscillated when the specimen 2 is machined. For example, the ion source 10 is tilted from the Z axis within a predetermined angle range. By oscillating the ion source 10, the ion beam IB can irradiate the machining surface of the specimen 2 from the diagonal direction. For example, the ion source 10 is tilted so that the incident angle of the ion beam IB becomes about 0.4° with respect to the machining surface of the specimen 2. In other words, the range of the tilt angle $\theta 2$ of the ion source 10 is from −0.4° to +0.4°. The tilt angle $\theta 2$ of the ion source 10 may be changed in accordance with the material or the like of the specimen 2.

Thus in the specimen machining device 100, the ion beam IB irradiates the specimen 2 and the specimen 2 is machined, while oscillating the specimen 2 and also oscillating the ion source 10. In the primary milling, two tilt surface 3 and a machining region 5, which is between the two tilt surface 3, are formed by the machining. In the primary milling, the entire machining region 5 is machined as to have thickness that is approximately the same as the thickness of the shielding member 30.

In the primary milling, machining ends when the second edge 2b of the specimen 2 reaches a thickness suitable for the secondary milling. As mentioned later, in the secondary milling, the specimen 2 is disposed such that the second edge 2b is at the top and the first edge 2a is at the bottom, and the ion beam IB irradiates the specimen 2 from the second edge 2b side. Therefore if the thickness of the specimen 2 on the second edge 2b side is large, the amount of the ion beam IB irradiating the second edge 2b side increases, and the second edge 2b side can be rapidly milled. Because of this, the specimen 2 may be milled out before the multi-layered film 6 is thinned. Therefore in the primary milling, the second edge 2b of the specimen 2 may be controlled to have a thickness suitable for the secondary milling.

The thickness of the second edge 2b of the specimen 2 here cannot be checked in the image photographed by the camera 60. Hence using the width of the machining region 5 on the second edge 2b side of the specimen 2, that is, the machining width W illustrated in FIG. 3, as a guide, the timing to end the machining of the primary milling is determined. In the specimen machining device 100, the machining region 5 of the specimen 2 becomes thinner and the machining width W increases as machining progresses. Therefore the thickness of the machining region 5 can be estimated based on the machining width W.

For example, by controlling the machining width W to about 300 μm to 600 μm, the thickness of the second edge 2b of the specimen 2 can be controlled to about 10 μm, which is the thickness suitable for the secondary milling.

The information processing device 70 controls the illumination system 40, and acquires a machining control image used for controlling machining and a display image which is displayed on the display unit 76. For example, in the primary milling, an image of the specimen 2 illuminated by the transmission illumination and the coaxial illumination is photographed by the camera 60, so as to acquire the machining control image. Further, in the primary milling, an image of the specimen 2 illuminated by the coaxial illumination is photographed by the camera 60, so as to acquire the display image. The illumination conditions under which the display image is photographed may be changed in accordance with the instruction by the user.

Figure 6:
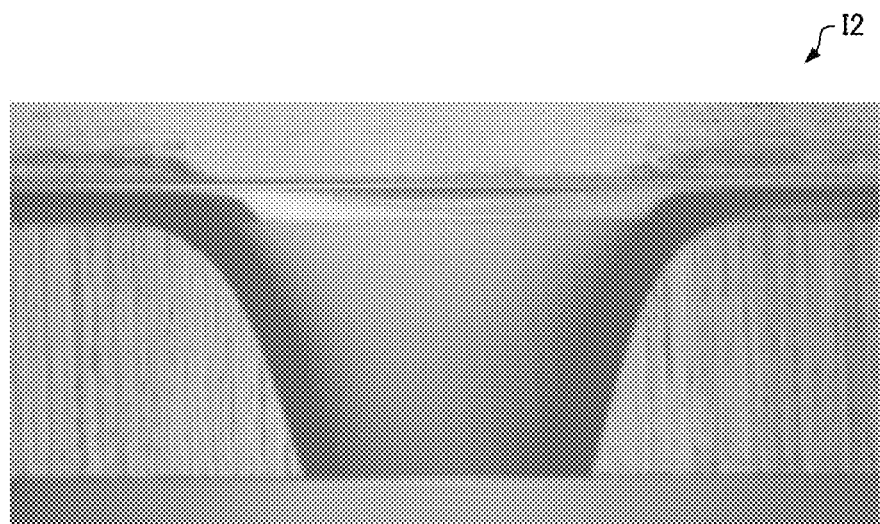
FIG. 6 is an example of a machining control image.

FIG. 6 illustrates an example of the machining control image I2 photographed by the camera 60. The machining control image I2 in FIG. 6 is an image acquired by photographing the specimen 2 illuminated by the coaxial illumination and the transmission illumination with the camera 60.

Since the specimen 2 is illuminated by the coaxial illumination, the machining region 5 of the specimen 2, the non-machining region of the specimen 2, and the shielding member 30 become bright, but the tilt surface 3 becomes dark in the machining control image I2, as illustrated in FIG. 6. This is because in the case of the coaxial illumination, the illumination light is reflected toward the camera 60 only on the surface vertical to the observation direction (optical axis of the camera 60). The tilt surface 3 is not a surface vertical to the observation direction, hence the illumination light reflected by the tilt surface 3 is not directed toward the camera 60. Therefore in the machining control image I2, the tilt surface 3 becomes dark. In the coaxial illumination, the orientation of the surface of each region of the specimen 2 does not change, even if the specimen 2 is oscillated. This means that in the coaxial illumination, an image in which the tilt surface 3 is dark is always acquired, even if the specimen 2 is oscillated during machining.

The specimen 2 is also illuminated by the transmission illumination, hence the illumination light leaks through the gap between the specimen 2 and the shielding member 30. Moreover, the illumination light strays into the space under the specimen 2. Therefore in the machining control image I2, the gap between the specimen 2 and the shielding member 30 and the space under the specimen 2 becomes bright. As a result, in the machining control image I2, only the tilt surface 3 becomes dark.

In the information processing device 70, two tilt surfaces 3 are extracted from the machining control image I2, utilizing that only the two tilt surfaces 3 become dark, and measures the machining width W by measuring the distance between the extracted two tilt surfaces 3.

Then the end of machining is determined by determining whether this machining width W reached a target machining width.

2.1.2. Secondary Milling

Figure 7:
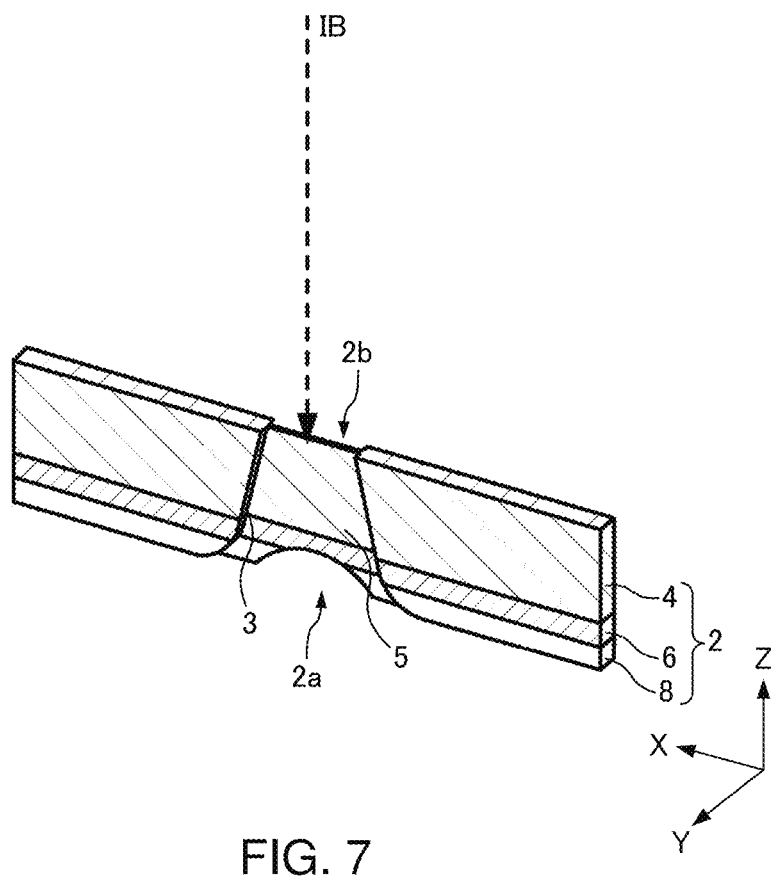
FIG. 7 is a diagram for explaining secondary milling.

FIG. 7 is a diagram for explaining the secondary milling.

As illustrated in FIG. 7, in the secondary milling, the specimen 2 is positioned such that the second edge 2b of the specimen 2 is at the top and the first edge 2a of the specimen 2 is at the bottom. Further, in the secondary milling, the ion beam IB irradiates the specimen 2 from the second edge 2b side. In the secondary milling, the ion beam IB irradiates the specimen 2 directly, without using the shielding member 30.

In the secondary milling, the specimen 2 is machined until the multi-layered film 6 of the specimen 2 is thinned to be observable by the transmission electron microscope.

The information processing device 70 controls the illumination system 40, and acquires a machining control image used for controlling machining and a display image which is displayed on the display unit 76. For example, in the secondary milling, the machining control image is acquired by photographing the specimen 2 illuminated by the transmission illumination with the camera 60. Further, in the secondary milling, an image of the specimen 2 illuminated by the transmission illumination and the coaxial illumination is photographed by the camera 60, so as to acquire the display image. The illumination conditions under which the display image is photographed may be changed in accordance with the instruction by the user.

Figure 8:
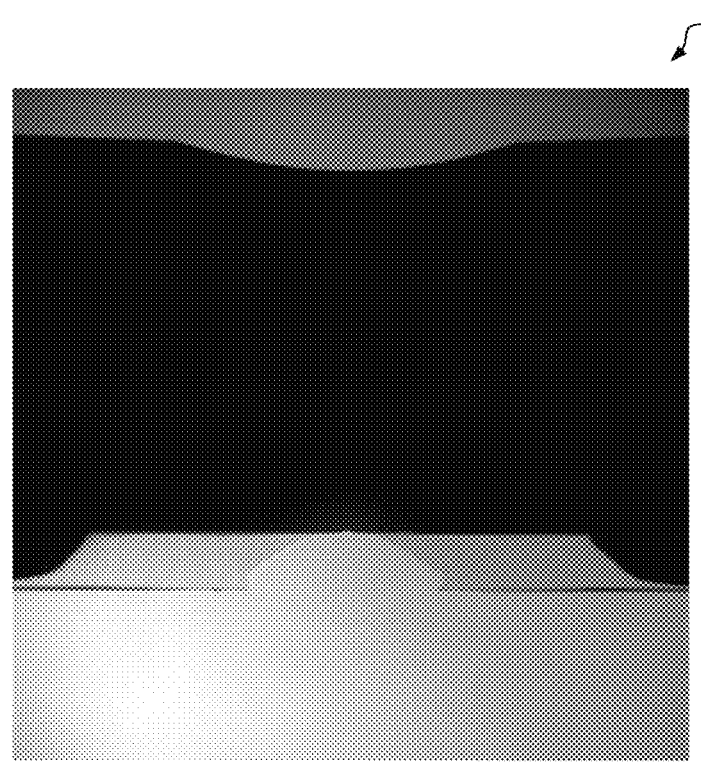
FIG. 8 is an example of a machining control image.

FIG. 8 illustrates an example of the machining control image I4 photographed by the camera 60. The machining control image I4 in FIG. 8 is an image acquired photographing the specimen 2 illuminated by the transmission illumination with the camera 60.

Since the specimen 2 is illuminated by the transmission illumination, the edge at the lower end (on the first edge 2a side) of the machining region 5 can be checked. Therefore the information processing device 70 detects the lower end edge of the machining region 5, and determines the end of the machining by detecting whether the lower end edge reached the target machining position.

2.2. Bulk Machining Method

Figure 9:
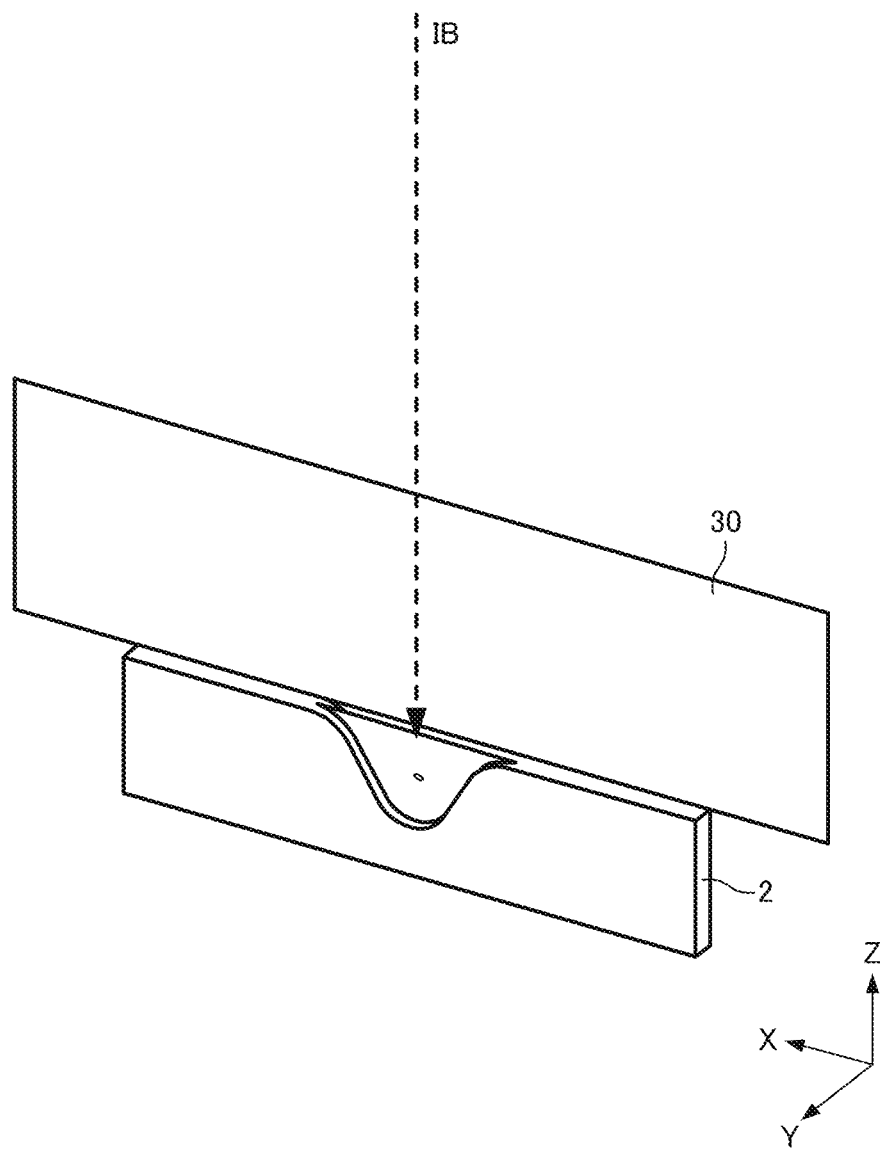
FIG. 9 is a diagram for explaining a bulk machining method.
Figure 10:
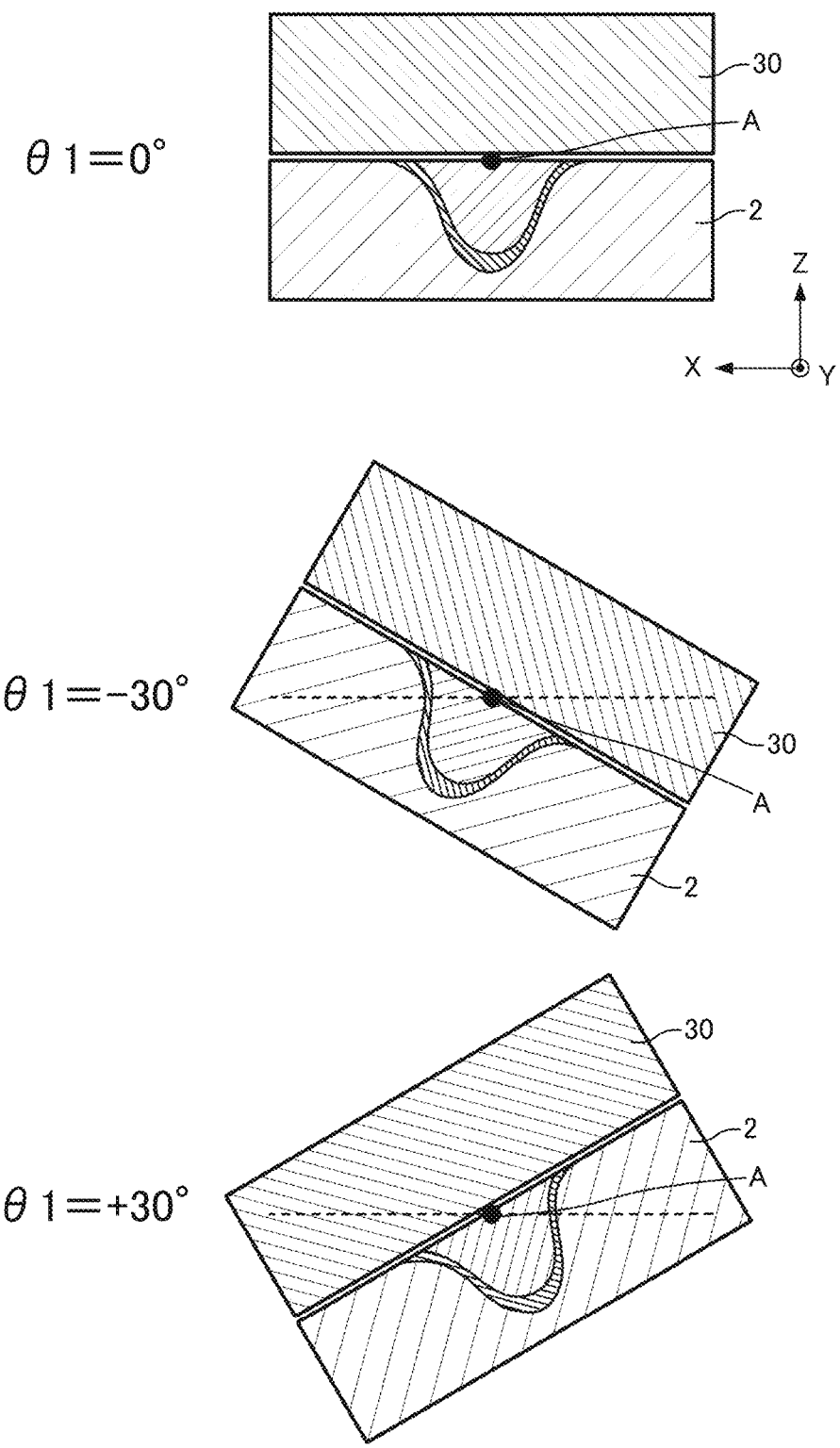
FIG. 10 is a diagram for explaining a bulk machining method.

FIG. 9 and FIG. 10 are diagrams for explaining the bulk machining method. FIG. 9 is a schematic perspective view of the specimen 2 and the shielding member 30. FIG. 10 is a diagram for explaining the oscillating operation of the specimen 2.

In the specimen machining device 100, the shielding member 30 is disposed on the specimen 2, as illustrated in FIG. 9, and the ion beam IB is emitted from the ion source 10 disposed above the shielding member 30. The ion beam IB irradiates the specimen 2 via the shielding member 30.

When the ion beam IB irradiates the specimen 2 for machining, the swing mechanism 22 of the specimen stage 20 is operated, as illustrated in FIG. 10, so as to oscillate the specimen 2 and the shielding member 30 with the axis A as the rotation axis. In other words, the swing mechanism 22 tilts and moves the specimen 2 and the shielding member 30 backward and forward with the axis A as the tilt axis.

FIG. 10 illustrates the states when the tilt angle θ1 of the specimen 2 is 0°, when the tilt angle θ1 of the specimen 2 is −30°, and when the tilt angle θ1 of the specimen 2 is +30°.

As illustrated in FIG. 5, the ion source 10 is also oscillated when the specimen 2 is machined. For example, the ion source 10 is tilted from the Z axis within a predetermined angle range. By oscillating the ion source 10, the ion beam IB can irradiate the machining surface of the specimen 2 from the diagonal direction. For example, the ion source 10 is tilted so that the incident angle of the ion beam IB becomes about 2.5° with respect to the machining surface of the specimen 2. In other words, the range of the tilt angle θ2 of the ion source 10 is from −2.5° to +2.5°.

The information processing device 70 controls the illumination system 40, and acquires a machining control image used for controlling the machining and a display image which is displayed on the display unit 76. For example, in the bulk machining method, an image of the specimen 2 illuminated by the transmission illumination is photographed by the camera 60, so as to acquire the machining control image. Further, in the bulk machining method, an image of the specimen 2 illuminated by the transmission illumination and the coaxial illumination is photographed by the camera 60, so as to acquire the display image. The illumination conditions under which the display image is photographed may be changed in accordance with the instruction by the user.

Figure 11:
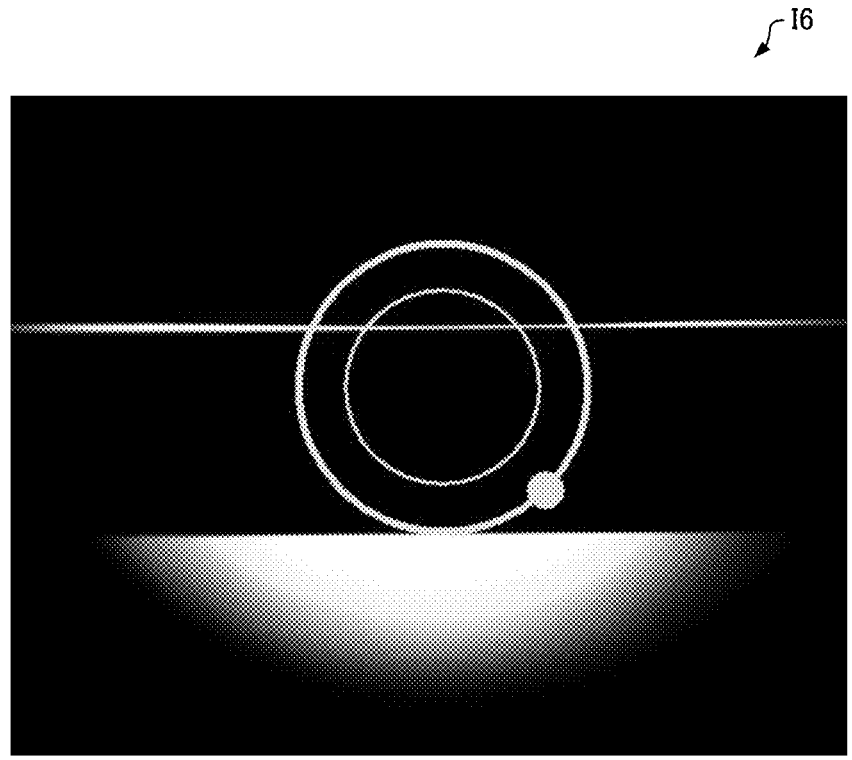
FIG. 11 is an example of a machining control image.

FIG. 11 illustrates an example of the machining control image I6 photographed by the camera 60. In the case where the specimen 2 is machined by the bulk machining method, the transmission illumination is performed on the specimen 2, the illumination light emitted from the transmission illumination device 42. Therefore in the machining control image I6, light that leaks through the gap between the specimen 2 and the shielding member 30 can be observed. Further, in the machining control image I6, the light that strays into the space under the specimen 2 can be observed.

In the information processing device 70, brightness of the light transmitted through the specimen 2 is detected out of the region enclosed by the double circles of the cursor, and the end of machining is determined based on the detected brightness.

3. Specimen Machining Method

3.1. Primary Milling Processing

Figure 12:
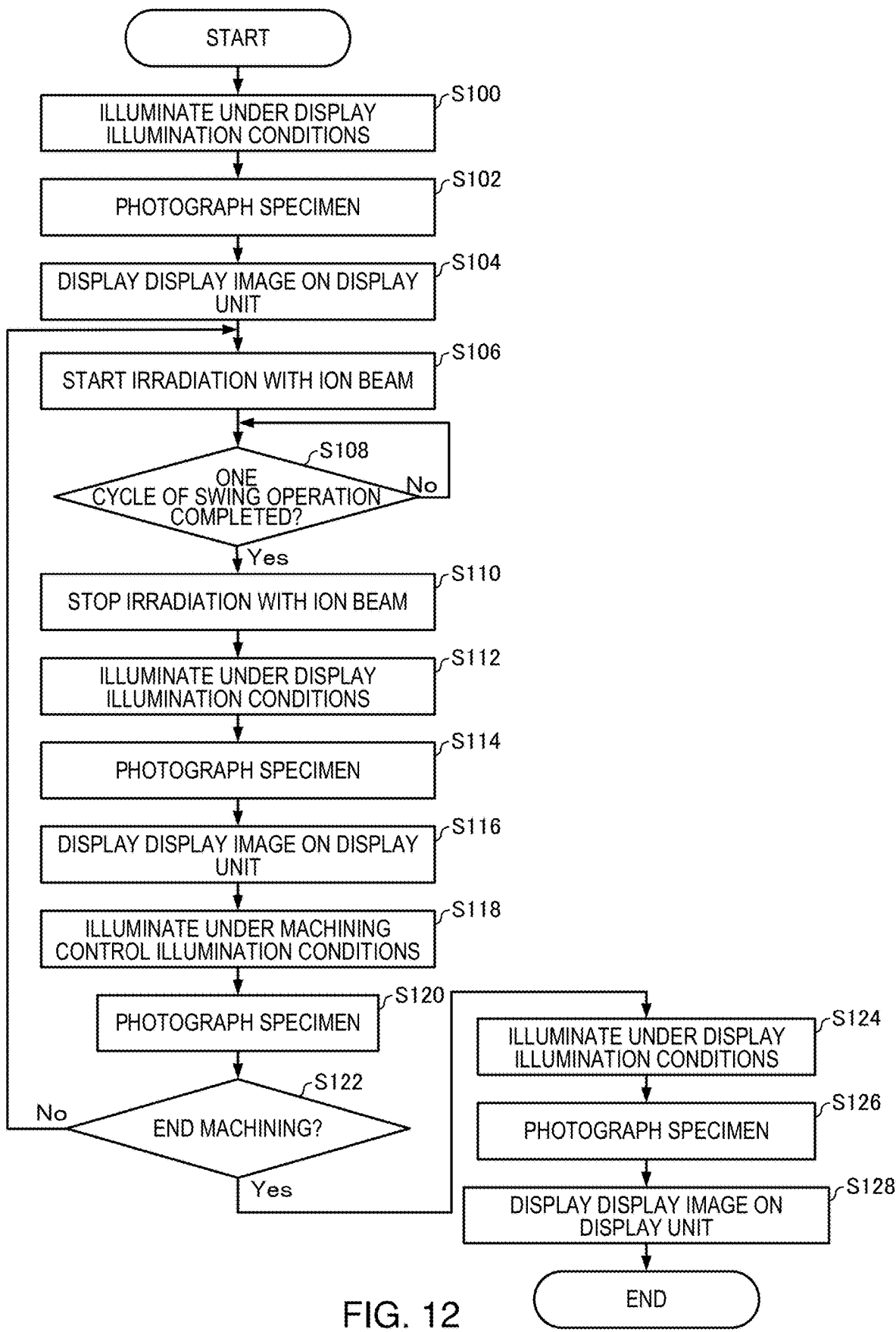
FIG. 12 is a flow chart illustrating an example of primary milling processing.

In the specimen machining device 100, the information processing device 70 performs the primary milling processing to machine the specimen 2 by the primary milling. FIG. 12 is a flow chart illustrating an example of the primary milling processing.

First the image acquiring unit 720 controls the illumination system 40 so that the specimen 2 is illuminated under the display illumination conditions (S100). Thereby the specimen 2 is illuminated under the display illumination conditions.

In the primary milling, the illumination system 40 is controlled so that the specimen 2 is illuminated by the coaxial illumination. In other words, the specimen 2 is illuminated by the transmission illumination device 42 and the coaxial illumination device 44. The illumination conditions when the display image is photographed may be set in advance, or may be set by the user using the operation unit 74.

Then the image acquiring unit 720 controls the camera 60 and photographs the specimen 2 illuminated under the display illumination conditions (S102). The image of the specimen 2 photographed by the camera 60 is sent to the information processing device 70.

Then the image acquiring unit 720 acquires the image sent from the camera 60, and generates the display image by magnifying or demagnifying the image so that the predetermined observation magnification is implemented. The display control unit 724 displays this display image on the display unit 76 (S104). Thereby the image of the specimen 2 is displayed on the display unit 76.

When the display image is displayed on the display unit 76, the machining control unit 722 starts processing to emit the ion beam IB (S106). Specifically, the machining control unit 722 generates a control signal to emit the ion beam IB, and sends the control signal to the control circuit 12. The control circuit 12 generates a drive signal based on the control signal, and outputs the drive signal to the ion source 10. Thereby the ion beam IB is emitted from the ion source 10 onto the specimen 2. At this time, the machining control unit 722 operates the swing mechanism 22 of the specimen stage 20, and oscillates the specimen 2 and the shielding member 30.

In the specimen machining device 100, the ion beam IB irradiates the specimen 2 via the shielding member 30 to machine the specimen 2, while oscillating the specimen 2 and the shielding member 30, and also oscillating the ion source 10.

The machining control unit 722 determines whether the swing mechanism 22 completed one cycle of operation (S108). As illustrated in FIG. 4, a one cycle operation of the swing mechanism 22 is from the state when the tilt angle θ1 of the specimen 2 is 0° (initial position) to the state when the tilt angle θ1 of the specimen 2 is −30°, to the state where the tilt angle θ1 is +30°, and then back to the state where the tilt angle θ1 is 0° again.

In the case where the machining control unit 722 determines that the swing mechanism 22 completed one cycle of operation (Yes in S108), the machining control unit 722 stops emission of the ion beam IB, the oscillation operation of the specimen 2 caused by the swing mechanism 22, and the oscillation operation of the ion source 10 (S110).

The image acquiring unit 720 controls the illumination system 40 so that the specimen 2 is illuminated under the display illumination conditions (S112). The image acquiring unit 720 controls the camera 60 and photographs the specimen 2 illuminated under the display illumination conditions (S114), and the display control unit 724 displays the display image on the display unit 76 (S116). Thereby the image of the specimen 2 that is currently being machined is displayed on the display unit 76.

Then the image acquiring unit 720 controls the illumination system 40 so that the specimen 2 is illuminated under the machining control illumination conditions (S118). In the primary milling, the illumination system 40 is controlled so that the specimen 2 is illuminated by the transmission illumination and the coaxial illumination. In other words, the transmission illumination is performed on the specimen 2 using the transmission illumination device 42, and the coaxial illumination is performed on the specimen 2 using the coaxial illumination device 44.

Then the image acquiring unit 720 controls the camera 60 and photographs the specimen 2 illuminated under the machining control illumination conditions (S120). The image of the specimen 2 photographed by the camera 60 is sent to the information processing device 70.

The image acquiring unit 720 receives the image from the camera 60, segments a predetermined region of this image, and performs image processing (e.g. change in magnification) on this region, so as to generate the machining control image. Based on this machining control image, the machining control unit 722 determines whether or not the machining is ended (S122).

Figure 13:
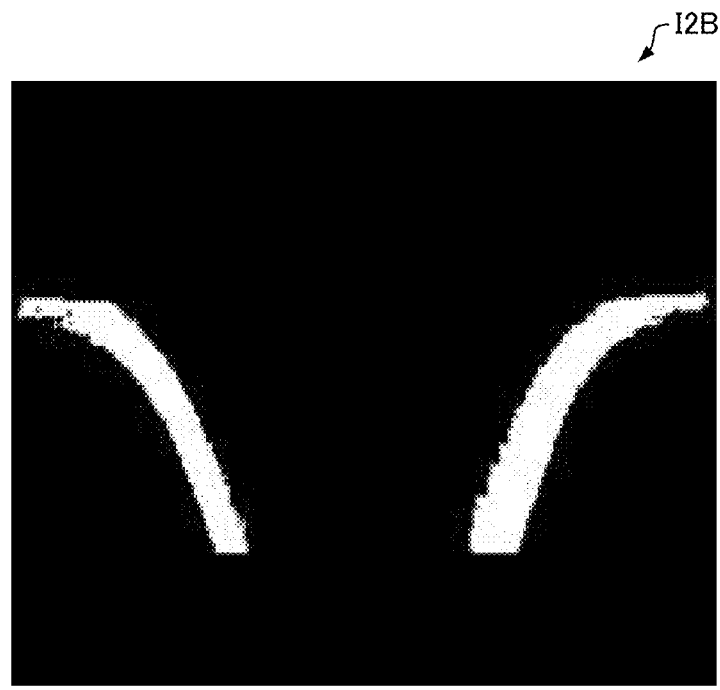
FIG. 13 is a diagram for explaining processing to determine whether or not machining is ended.
Figure 14:
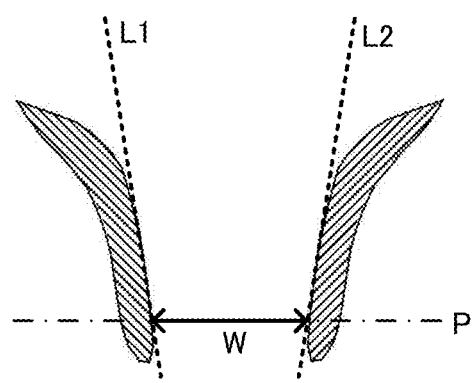
FIG. 14 is a diagram for explaining processing to determine whether or not machining is ended.

FIG. 13 and FIG. 14 are diagrams for explaining the processing to determine whether the machining is ended.

As illustrated in FIG. 13, the machining control unit 722 binarizes the machining control image and generates a binary image I2B. Thereby the tilt surfaces 3 can be extracted. Then in this binary image I2B, the machining control unit 722 specifies aggregates of white pixels which correspond to the tilt surface 3, and measures the machining width W by measuring the distance between the two aggregates. To measure the machining width W, the edges of the two aggregates are linearly approximated respectively, whereby an approximated line L1 and an approximated line L2 are drawn, as illustrated in FIG. 14. Then at the position P to measure the machining width W, the distance between the approximated line L1 and the approximated line L2 is determined. Thereby the machining width W can be measured. The position P at which the machining width W is measured is set in advance, and is specified by the positional coordinates of the binary image I2B in the vertical direction, for example.

The machining control unit 722 determines whether the machining width W reached a target machining width TW or more. In other words, the machining control unit 722 determines whether W≥TW is satisfied. If W≥TW is satisfied, the machining control unit 722 determines that the machining is ended.

In the case where the machining control unit 722 determines that the machining is not ended (No in S122), the processing unit 72 returns to processing S106, and performs processing steps S106, S108, S110, S112, S114, S116, S118, S120 and S122.

The processing unit 72 repeats the processing steps S106, S108, S110, S112, S114, S116, S118, S120 and S122 until it is determined that the machining is ended.

In the case where the machining control unit 722 determines that the machining is ended (Yes in S122), the machining control unit 722 returns the specimen 2 back to the initial position (tilt angle θ1=0°), and the image acquiring unit 720 controls the illumination system 40 so that the specimen 2 is illuminated under the display illumination conditions (S124). The image acquiring unit 720 controls the camera 60, and photographs the specimen 2 illuminated under the display illumination conditions (S126), and the display control unit 724 displays the display image on the display unit 76 (S128). Thereby the image of the specimen 2 after the machining is ended is displayed on the display unit 76. Then the processing unit 72 ends the primary milling processing.

3.2. Secondary Milling Processing

In the specimen machining device 100, the information processing device 70 performs the secondary milling processing to machine the specimen 2 by the secondary milling.

In the above mentioned primary milling processing, in the processing S118, the image acquiring unit 720 controls the illumination system 40 so that the specimen 2 is illuminated under the machining control illumination conditions, the illumination system 40 is controlled so that the specimen 2 is illuminated by the transmission illumination and the coaxial illumination.

In the secondary milling processing, on the other hand, the image acquiring unit 720 controls the illumination system 40 in the processing S118 so that the specimen 2 is illuminated by the transmission illumination, which is different from the primary milling processing. In other words, in the secondary milling processing, transmission illumination is performed on the specimen 2 by the transmission illumination device 42 in the processing S118.

Further, in the above mentioned primary milling processing, the illumination system 40 is controlled so that the specimen 2 is illuminated by the coaxial illumination in the processing steps S100, S112 and S124 in which the illumination system 40 is controlled such that the specimen 2 is illuminated under the display illumination conditions. In the secondary milling processing, on the other hand, the illumination system 40 is controlled so that the specimen 2 is illuminated by the transmission illumination and the coaxial illumination.

In the secondary milling processing, the processing S122 to determine whether the machining is ended is also different from the primary milling processing.

In the secondary milling processing, the machining control unit 722 detects the lower end edge of the machining region 5, and determines whether the machining is ended depending on whether the position of the detected lower end edge reached the target position.

Figure 15:
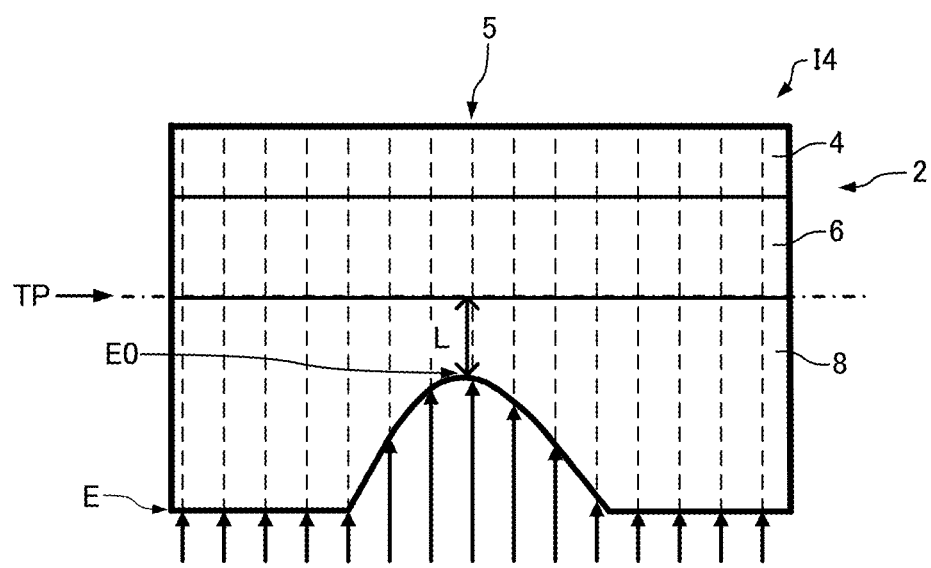
FIG. 15 is a diagram for explaining processing to detect a lower end edge of a machining region.

FIG. 15 is a diagram for explaining the processing to detect the lower end edge E of the machining region 5. In FIG. 15, the broken line indicates a line to acquire the brightness profile for detecting the lower end edge E of the machining region 5.

As illustrated in FIG. 15, the machining control unit 722 acquires a plurality of brightness profiles in the vertical direction of the machining control image I4, and specifies the position of the lower end edge E of the machining region 5. In the brightness profile of the machining control image I4 in the vertical direction, the brightness largely changes in the lower end edge E of the machining region 5, therefore the edge E is detected based on this change of brightness. The machining control unit 722 specifies an edge E0 of which distance from the target position TP is the shortest in the detection result of the edge E in the plurality of brightness profiles. The machining control unit 722 calculates the distance L between the edge E0 and the target position TP. In the case where the edge E0 of the machining region 5 reached the target position TP, that is, in the case where L=0 is detected, the machining control unit 722 determines that the machining is ended.

As described above, the secondary milling processing is performed in the same manner as the above mentioned primary milling process, except that the machining control illumination conditions, the display illumination conditions and the method for determining whether the machining is ended are different.

3.3. Bulk Machining Processing

Figure 16:
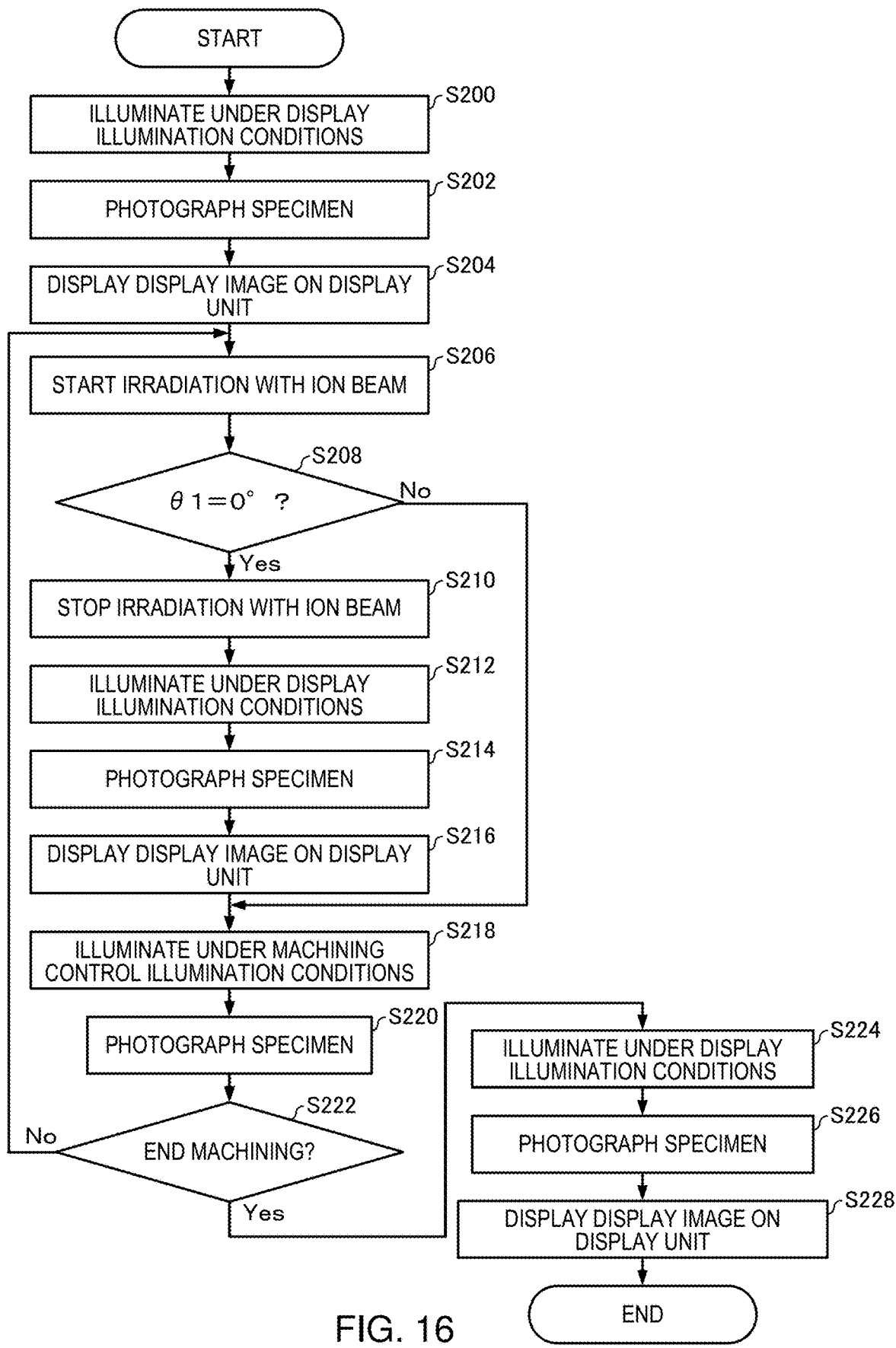
FIG. 16 is a flow chart illustrating an example of bulk machining processing.

In the specimen machining device 100, the information processing device 70 performs the bulk machining processing to machine the specimen 2 by the bulk machining method. FIG. 16 is a flow chart illustrating an example of the bulk machining processing.

First the image acquiring unit 720 controls the illumination system 40 so that the specimen 2 is illuminated under the display illumination conditions (S200). Thereby the specimen 2 is illuminated under the display illumination conditions.

In the bulk machining, the illumination system 40 is controlled so that the specimen 2 is illuminated by the transmission illumination and the coaxial illumination. In other words, the transmission illumination is performed on the specimen 2 using the transmission illumination device 42, and the epi-illumination is performed on the specimen 2 using the coaxial illumination device 44. The illumination conditions when the display image is photographed may be set in advance in accordance with the machining method, or may be set by the user using the operation unit 74.

Then the image acquiring unit 720 controls the camera 60 and photographs the specimen 2 illuminated under the display illumination conditions (S202). The image acquiring unit 720 acquires the image sent from the camera 60, and generates the display image by magnifying or demagnifying the image so that the predetermined observation magnification is implemented. The display control unit 724 displays this display image on the display unit 76 (S204).

When the display image is displayed on the display unit 76, the machining control unit 722 starts processing to emit the ion beam IB (S206).

The machining control unit 722 determines whether the tilt angle θ1 of the specimen 2 is 0° (S208). If it is determined that the tilt angle θ1 is 0° (Yes in S208), the machining control unit 722 stops emission of the ion beam IB, the oscillation operation of the specimen 2 caused by the swing mechanism 22, and the oscillation operation of the ion source 10 (S210).

The image acquiring unit 720 controls the illumination system 40 so that the specimen 2 is illuminated under the display illumination conditions (S212). The image acquiring unit 720 controls the camera 60 and photographs the specimen 2 illuminated under the display illumination conditions (S214), and the display control unit 724 displays the display image on the display unit 76 (S216). Thereby the image of the specimen 2 that is currently being machined is displayed on the display unit 76.

After the processing S216 where the display image is displayed on the display unit 76, the image acquiring unit 720 controls the illumination system 40 so that the specimen 2 is illuminated under the machining control illumination conditions (S218). If it is determined that the tilt angle θ1 is not 0° (No in S208), the image acquiring unit 720 controls the illumination system 40 in the same manner so that the specimen 2 is illuminated under the machining control illumination conditions (S218).

In the bulk machining, the illumination system 40 is controlled so that the transmission illumination is performed on the specimen 2. In other words, the transmission illumination is performed on the specimen 2 using the transmission illumination device 42, and the coaxial illumination device 44 is turned OFF.

Then the image acquiring unit 720 controls the camera 60 and photographs the specimen 2 illuminated under the machining control illumination conditions (S220). The image of the specimen 2 photographed by the camera 60 is sent to the information processing device 70.

The image acquiring unit 720 receives the image from the camera 60, segments a predetermined region, and performs image processing (e.g. change of magnification) on this region, so as to generate the machining control image. Based on this machining control image, the machining control unit 722 determines whether the machining is ended (S222).

Figure 17:
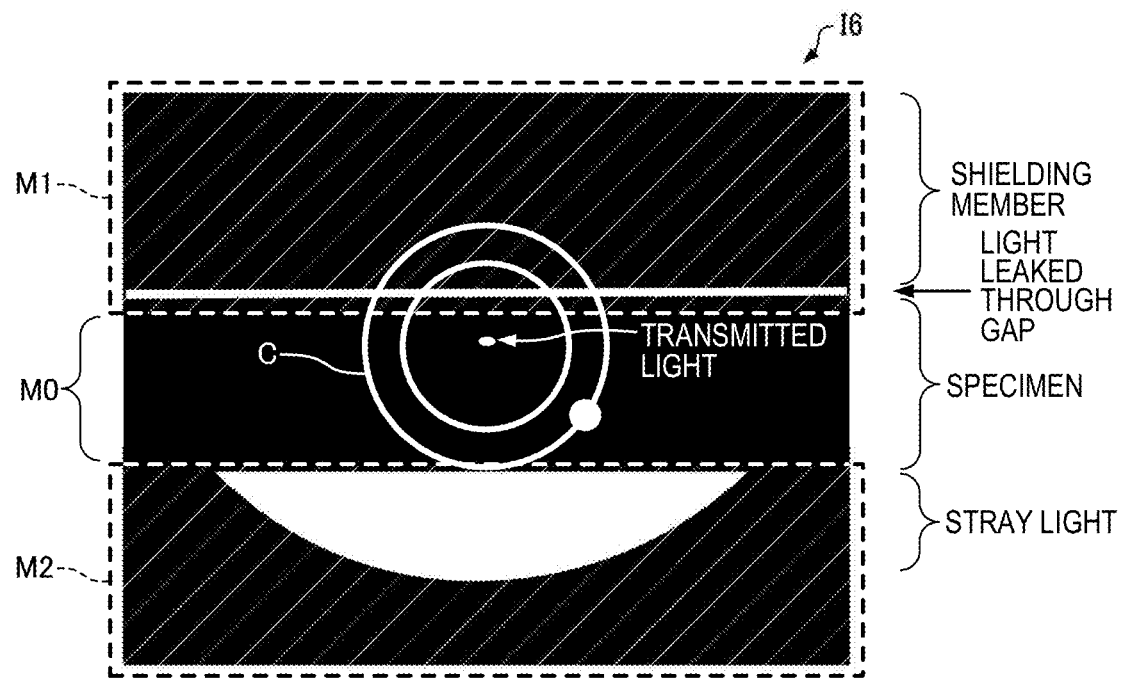
FIG. 17 is a diagram for explaining processing to determine whether or not machining is ended.

FIG. 17 is a diagram for explaining the processing to determine whether the machining is ended.

As illustrated in FIG. 17, the machining control unit 722 masks the light which leaks through the gap between the specimen 2 and the shielding member 30, and the light which strays into the space under the specimen 2, based on the distribution of the brightness of the machining control image I6. For example, a plurality of brightness profiles of the machining control image I6 in the vertical direction are acquired, and based on these brightness profiles, the machining control unit 722 generates a mask region M1 to mask the light which leaks through the gap, and a mask region M2 to mask the light which strays into the space under the specimen 2. By generating the mask region M1 and the mask region M2, a region corresponding to the specimen 2 can be extracted from the machining control image I6. Further, by generating the mask region M1 and the mask region M2, the region corresponding to the specimen 2 can be extracted from the machining control image I6, even in the case where the specimen 2 is tilted (in the case of tilted angle θ1≠0°).

The machining control unit 722 detects the maximum brightness in a non-mask region M0, which is a region of the machining control image I6 excluding the mask region M1 and the mask region M2. For example, the machining control unit 722 detects the maximum brightness in the non-mask region M0 in the region specified by the cursor C.

As the machining progresses and the machining region of the specimen 2 becomes thin, the illumination light starts to transmit through the specimen 2. When the illumination light transmits through the specimen 2, the brightness of the region corresponding to the transmitting light in the machining control image I6 increases. The machining control unit 722 detects this increase in brightness by detecting the maximum brightness in the non-mask region M0, whereby the end of machining is determined. For example, the machining control unit 722 determines that the machining is ended in the case where the maximum brightness reaches the threshold or more. The threshold may be set based on the light leaking through the gap between the specimen 2 and the shielding member 30. For example, the machining control unit 722 may determine that the machining is ended in the case where the maximum brightness reached 80% of the light leaking through the gap.

In the case where the machining control unit 722 determines that the machining is not ended (No in S222), the processing unit 72 returns to processing S206, and performs processing steps S206, S208, S210, S212, S214, S216, S218, S220 and S222.

The processing unit 72 repeats the processing steps S206, S208, S210, S212, S214, S216, S218, S220 and S222 until the end of machining is determined.

In the case where the machining control unit 722 determines that the machining is ended (Yes in S222), the machining control unit 722 stops emission of the ion beam IB, and returns the specimen 2 back to the initial position (tilt angle θ1=0°). The image acquiring unit 720 also controls the illumination system 40 so that the specimen 2 is illuminated under the display illumination conditions (S224). The image acquiring unit 720 controls the camera 60 and photographs the specimen 2 illuminated under the display illumination conditions (S226), and the display control unit 724 displays the display image on the display unit 76 (S228). Thereby the image of the specimen 2 after the machining is ended is displayed on the display unit 76. Then the processing unit 72 ends the bulk machining processing.

In the above mentioned primary milling processing and secondary milling processing, the display image and the control image are acquired once every cycle of the oscillating operation of the specimen 2. In the bulk machining processing, on the other hand, the display image is acquired in the case of the tilt angle θ1=0°, and the machining control image is constantly acquired regardless the tilt angle. In the bulk machining, it is preferable to end machining immediately before the specimen 2 is pierced with a hole, and the timing of ending the machining must be determined more accurately than the primary milling and the secondary milling. By constantly acquiring the control image, regardless the tilt angle θ1, the timing of ending the machining can be accurately determined.

4. Effects

In the specimen machining device 100, the processing unit 72 performs: the processing to control the illumination system 40 so that the specimen 2 is illuminated under the machining control illumination conditions; the processing to acquire the machining control image by photographing the specimen 2, which is illuminated under the machining control illumination conditions, using the camera 60; the processing to control the ion source 10 based on the machining control image; the processing to control the illumination system 40 so that the specimen 2 is illuminated under the display illumination conditions, which are different from the machining control illumination conditions; the processing to acquire the display image by photographing the specimen 2, which is illuminated under the display illumination conditions, using the camera 60; and the processing to display the display image on the display unit 76.

Therefore in the specimen machining device 100, the machining control image and the display image can be photographed under different illumination conditions. As a result, in the specimen machining device 100, an image suitable for the machining control image and an image suitable for the display image can be acquired. Therefore machining can be accurately performed by appropriately controlling the ion source using the machining control image, and the user can accurately recognize the machining state by the display image displayed on the display unit 76.

The machining control image is preferably an image that is always photographed under the same illumination conditions, but it is preferable that the user can freely change the illumination conditions for the display image, even during the machining. In the specimen machining device 100, the machining control image and the display image can be photographed under different illumination conditions, hence while the machining control image is always photographed under the same illumination conditions, the display image can be photographed under the illumination conditions freely set by the user.

Figure 18:
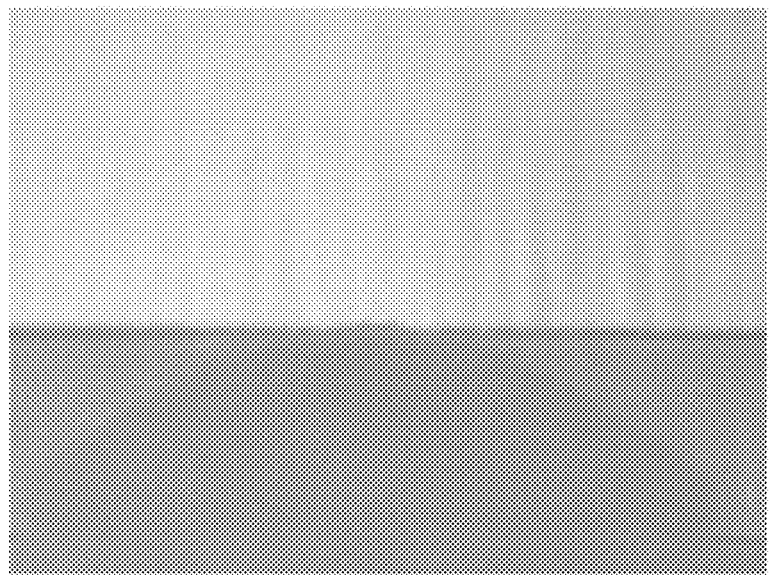
FIG. 18 is an image acquired by photographing a specimen illuminated by transmission illumination and coaxial illumination.
Figure 19:
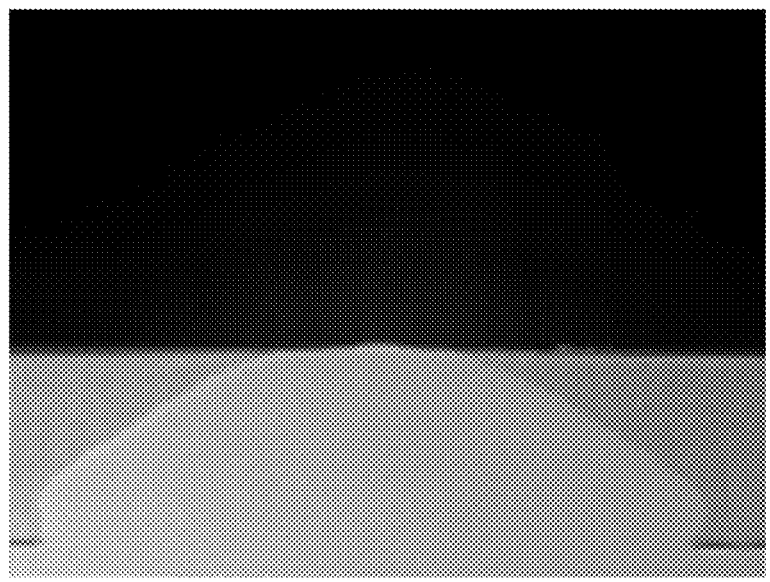
FIG. 19 is an image acquired by photographing a specimen illuminated by transmission illumination.

FIG. 18 is an image of the specimen 2 illuminated by the transmission illumination and the coaxial illumination, photographed by the camera 60 in the secondary milling. FIG. 19 is an image of the specimen 2, illuminated by the transmission installation, photographed by the camera 60 in the secondary milling.

In the secondary milling, in the case where an image of the specimen 2 illuminated by the transmission illumination and the reflection illumination is photographed by the camera 60, the state where the substrate 4 and the multi-layered film 6 are milled can be observed, as illustrated in FIG. 18. In the case where an image of the specimen 2 illuminated by the transmission illumination is photographed by the camera 60, on the other hand, the machined edge formed on the protective member 8 (glass) can be clearly observed, as illustrated in FIG. 19.

Figure 20:
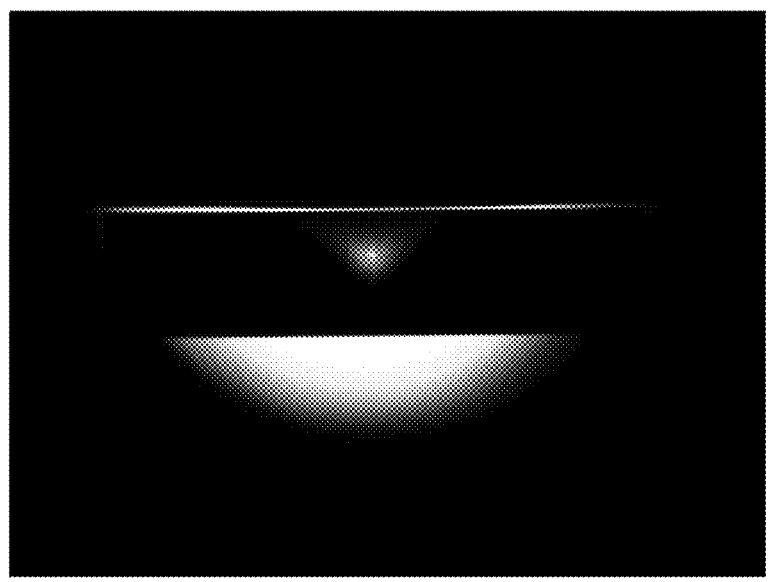
FIG. 20 is an image acquired by photographing a specimen illuminated by transmission illumination.
Figure 21:
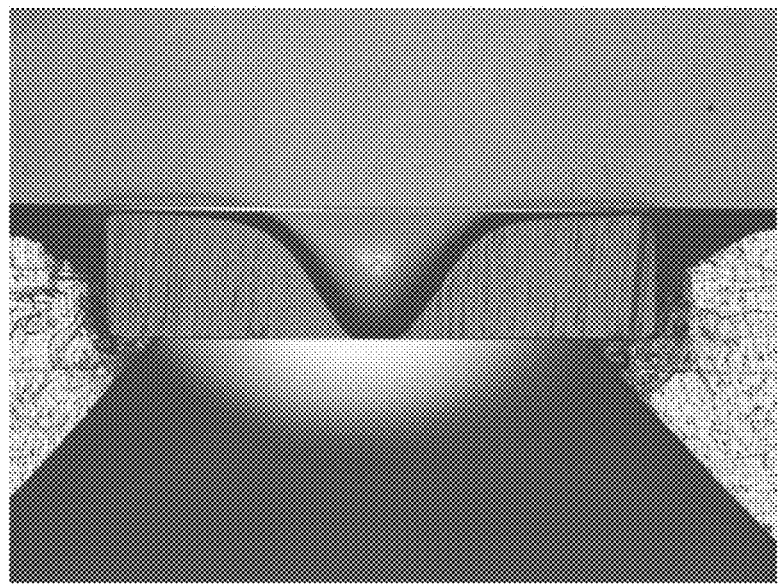
FIG. 21 is an image acquired by photographing a specimen illuminated by transmission illumination and coaxial illumination.

FIG. 20 is an image of the specimen 2, illuminated by the transmission illumination, photographed by the camera 60 in the bulk machining. FIG. 21 is an image of the specimen 2, illuminated by the transmission illumination and the coaxial illumination, photographed by the camera 60 in the bulk machining.

In the bulk machining, in the case where an image of the specimen 2 illuminated by the transmission illumination is photographed by the camera 60, the state where the specimen 2 becomes thin can be observed, as illustrated in FIG. 20. In the case where an image of the specimen 2 illuminated by the transmission illumination and the reflection illumination is photographed by the camera 60, on the other hand, the machined edge of the specimen 2 can be observed, as illustrated in FIG. 21.

In this way, information acquired from an image of the specimen 2 changes by capturing the image under different illumination conditions. Therefore the machining state of the specimen 2 can be more accurately recognized by photographing the specimen 2 under different illumination conditions.

In the specimen machining device 100, the processing unit 72 stops the ion source 10 from emitting the ion beam IB before photographing the specimen 2 illuminated under the display illumination conditions with the camera 60. Therefore in the specimen machining device 100, it can be prevented that the specimen 2 is machined by the ion beam IB while the display image is being photographed.

5. Modifications

5.1. Modification 1

In the embodiments described above, the machining control unit 722 determines the end of machining, but a mode in which the user determines the end of machining and a mode in which the machining control unit 722 determines the end of machining, for example, may be selectable.

For example, in the mode where the user determines the end of machining, the user checks the machining state by observing the display image displayed on the display unit 76, and determines whether the machining is ended. The machining control unit 722 stops emission of the ion beam IB when the user inputs an instruction to end the machining using the operation unit 74.

5.2. Modification 2

In the embodiments described above, the display illumination conditions are set in advance, but the display illumination conditions may be changed based on the instruction by the user.

For example, when the user inputs an instruction to change the display illumination conditions using the operation unit 74, the image acquiring unit 720 receives the instruction to change the display illumination conditions, changes the display illumination conditions based on this instruction, and controls the illumination system 40 so that the specimen 2 is illuminated under the updated display illumination conditions.

For example, in the primary milling processing described above, the user inputs an instruction to change the display illumination conditions to the transmission illumination using the operation unit 74, then the image acquiring unit 720 controls the transmission illumination device 42 so that the transmission illumination is performed on the specimen 2. At this time, the image acquiring unit 720 turns the coaxial illumination device 44 OFF. The image acquiring unit 720 receives the instruction to change the display illumination conditions before the processing S112, illustrated in FIG. 12, for example.

By the processing unit 72 receiving the instruction to change the display illumination conditions, changing the display illumination conditions based on this instruction, and controlling the illumination system 40 so that the specimen 2 is illuminated under the updated display illumination conditions, as described above, the user can observe the specimen 2 that is being machined under various illumination conditions.

5.3. Modification 3

In Modification 2 described above, the display illumination conditions are changed, but the magnification of the display image and the field-of-view of the display image may be changeable.

For example, in the case where the user inputs an instruction to change the magnification of the display image using the operation unit 74, the image acquiring unit 720 receives the instruction to change the magnification of the display image, and changes the magnification of the display image based on this instruction to change the magnification. The display control unit 724 displays the display image, of which magnification is updated, on the display unit 76.

In the case where the user inputs an instruction to change the field-of-view of the display image using the operation unit 74, the image acquiring unit 720 receives the instruction to change the field-of-view of the display image, and changes the field-of-view of the display image based on this instruction to change the field-of-view. The display control unit 724 displays the display image, of which field-of-view is updated, on the display unit 76.

In the case where the user inputs an instruction to change both the magnification and the field-of-view of the display image, the image acquiring unit 720 receives the instruction to change the magnification and the field-of-view of the display image, and changes the magnification and the field-of-view of the display image based on this instruction to change the magnification and the field-of-view. The display control unit 724 displays the display image of which magnification and field-of-view are updated, on the display unit 76.

Figure 22:
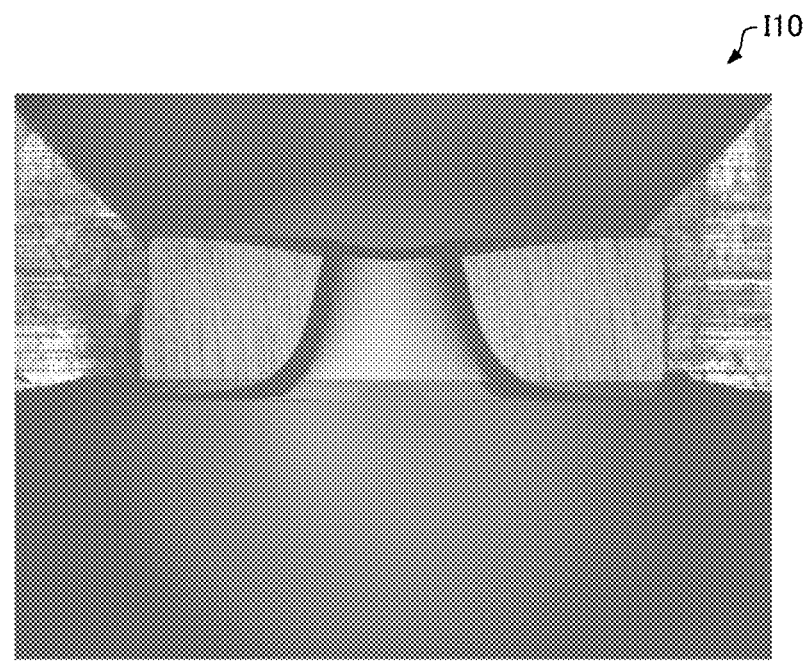
FIG. 22 is an image for explaining processing to change magnification and a field-of-view of a display image.
Figure 23:
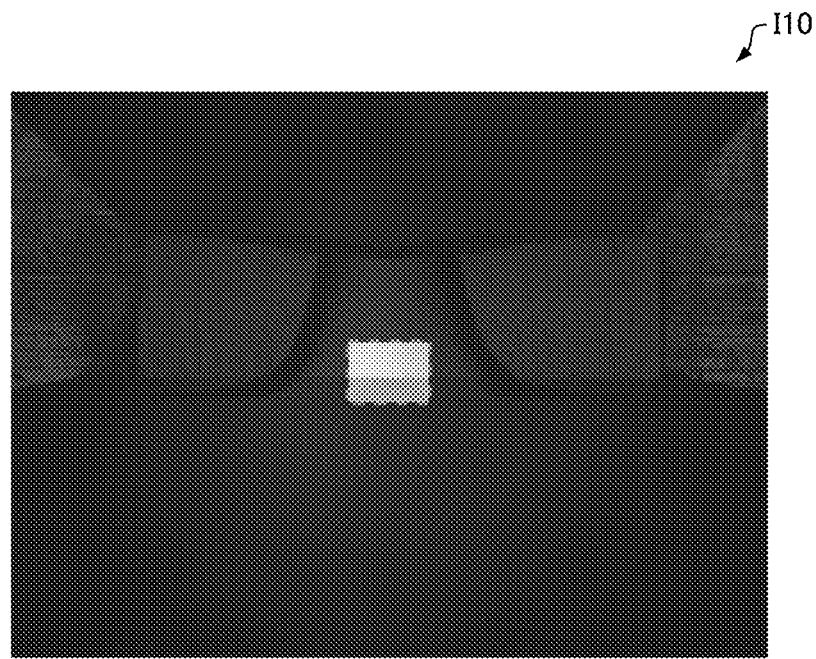
FIG. 23 is an image for explaining processing to change magnification and a field-of-view of a display image.
Figure 24:
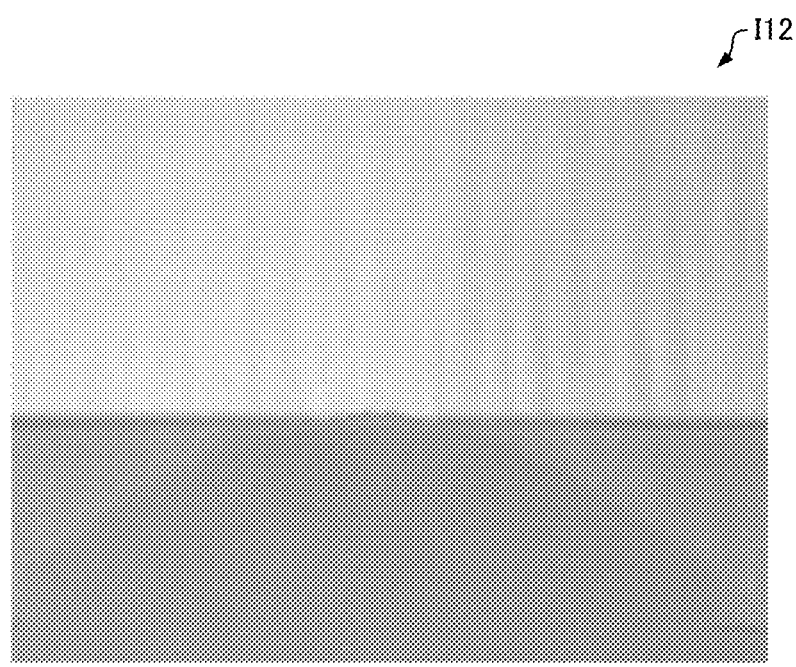
FIG. 24 is an image for explaining processing to change magnification and a field-of-view of a display image.

FIG. 22 to FIG. 24 are images for explaining the processing to change the magnification and the field-of-view of the display image. The image I10 in FIG. 22 is an image of all the pixels of the camera 60 photographed by the camera 60, FIG. 23 illustrates the state of segmenting an instructed region from the image I10, and the image I12 in FIG. 24 is an image generated by segmenting the instructed region from the image I10 and magnifying the segmented region.

The camera 60 is a high pixel camera. Therefore as illustrated in FIG. 23, the image acquiring unit 720 segments the region instructed by the user, from the image I10 in FIG. 22, and magnifies the segmented region, whereby an image I12 is generated. Then the display control unit 724 displays the image I12 on the display unit 76 as the display image. In this way, the image acquiring unit 720 changes the magnification using digital zoom. Further, the field-of-view can be changed by changing the segmenting position in the image I10. Thus the image acquiring unit 720 changes the magnification and the field-of-view of the display image by image processing.

In the case where the user inputs an instruction to change the brightness of the display image using the operation unit 74, the image acquiring unit 720 receives the instruction to change the brightness of the display image, and changes the brightness of the display image based on this instruction to change the brightness. In the case where the user inputs an instruction to change the contrast of the display image using the operation unit 74, the image acquiring unit 720 receives the instruction to change the contrast of the display image, and changes the contrast of the display image based on this instruction to change the contrast.

The brightness or contrast of the display image is changed performing image processing on the image photographed by the camera 60.

In this way, in the specimen machining device 100, the magnification, the field-of-view, the brightness and the contrast of the display image can be freely changed.

The image acquiring unit 720 may display a plurality of display images having different magnifications and fields-of-view side-by-side on the display unit 76.

Figure 25:
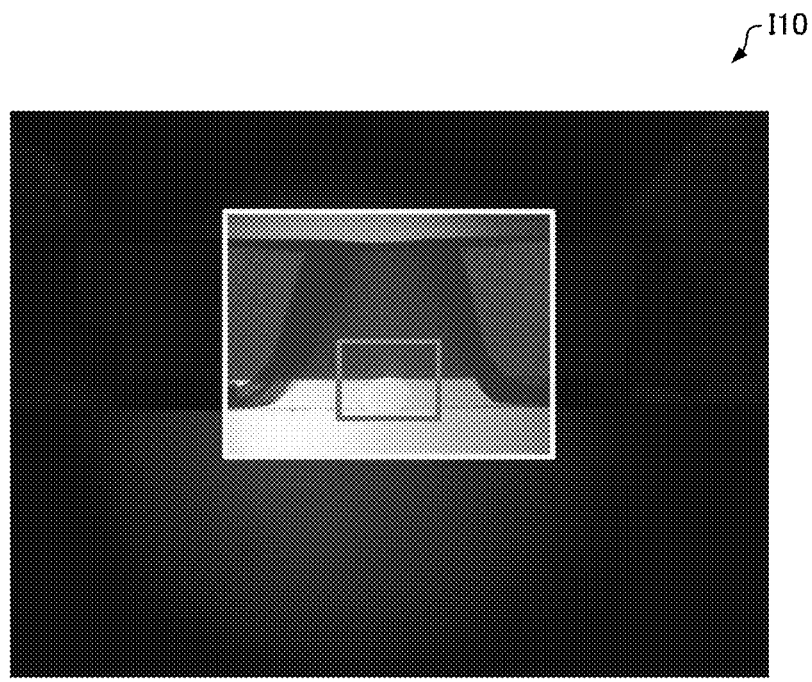
FIG. 25 illustrates processing to segment two regions instructed from an image photographed by a camera.
Figure 26:
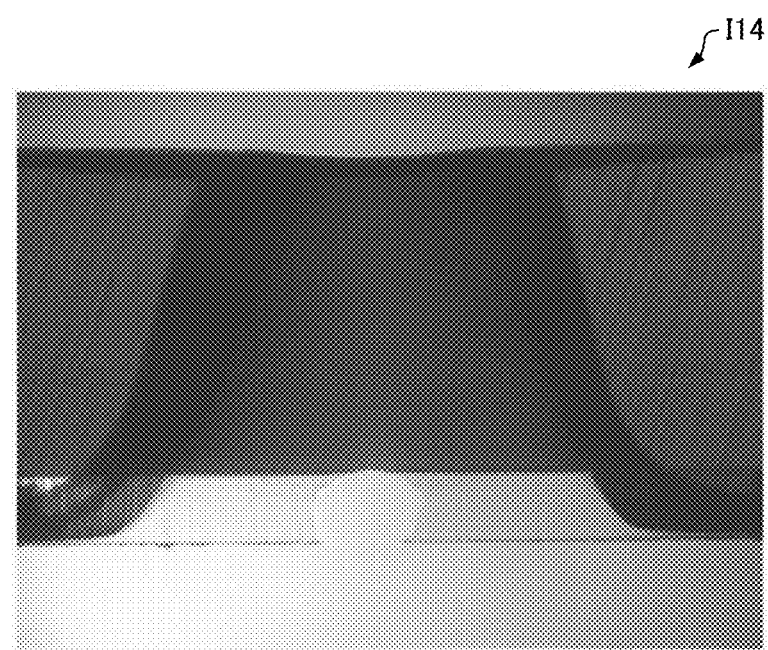
FIG. 26 is an image obtained by segmenting an instructed region from an image and magnifying it.
Figure 27:
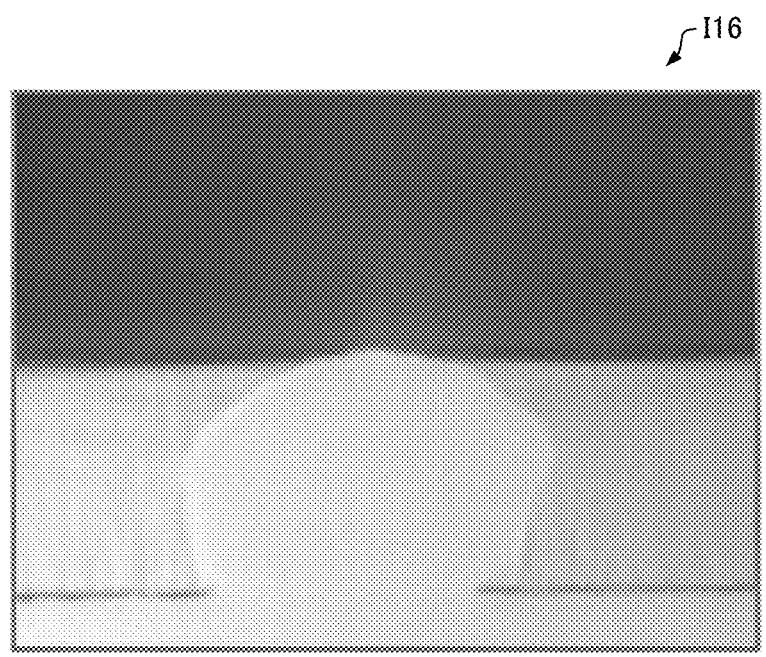
FIG. 27 is an image obtained by segmenting an instructed region from an image and magnifying it.

FIG. 25 illustrates processing to segment the instructed two regions from the image I10 photographed by the camera 60. FIG. 26 illustrates an image I14 generated by segmenting the instructed regions from the image I10 and magnifying the segmented regions. FIG. 27 illustrates an image I16 generated by segmenting the instructed regions from the image I10 and magnifying the segmented regions.

As illustrated in FIG. 25, the image acquiring unit 720 segments the two regions specified by the user and magnifying the segmented regions, so as to generate the image I14 and the image I16. The display control unit 724 displays the image I14 and the image I16 side-by-side on the display unit 76. The display control unit 724 may display the image I14 and the image I16 alternately on the display unit 76.

Here the size (area) of the image I14 segmented from the image I10 is larger than the size (area) of the image I16 segmented from the image I10. When the image I14 and the image I16 are displayed on the display unit 76, the size of the image I14 and the size of the image I16 are the same. This means that two images (image I14 and image I16) having different magnifications are displayed on the display unit 76.

5.4. Modification 4

In Modification 3 described above, the image acquiring unit 720 segments a region, which the user specified from the image I10 photographed by the camera 60, and magnifies the region, so as to generate the display image.

However, in order to generate the display image, the image acquiring unit 720 may repeat the processing steps to acquire the machining control image and detect a region, in which change is large, from the repeatedly acquired machining control images, and magnify a region of the display image corresponding to the detected position in which change is large.

For example, in the primary milling processing, the machining width W is measured in the processing S122 in which whether machining is ended is determined. For example, the machining control unit 722 compares a machining control image acquired for the n-th time and a machining control image acquired for the (n−1)-th time, and detects a region in which change is large. In the primary milling, as the ion beam IB is emitted, the machining region 5 increases and the distance between the two tilt surfaces 3 increases. Therefore a region including the two tilt surfaces 3 is detected as a region in which change is large. The machining control unit 722 specifies a position (coordinates) of the detected region in which change is large, and the image acquiring unit 720 magnifies a region of the display image corresponding to the detected position of the region in which change is large. The display control unit 724 displays the display image, generated by magnifying the region in which change is large, on the display unit 76.

In the secondary milling processing and the bulk machining processing as well, the machining control unit 722 detects a region in which change of the machining control image is large, and the image acquiring unit 720 magnifies a region of the display image corresponding to the detected position of the region in which change is large.

5.5. Modification 5

Figure 28:
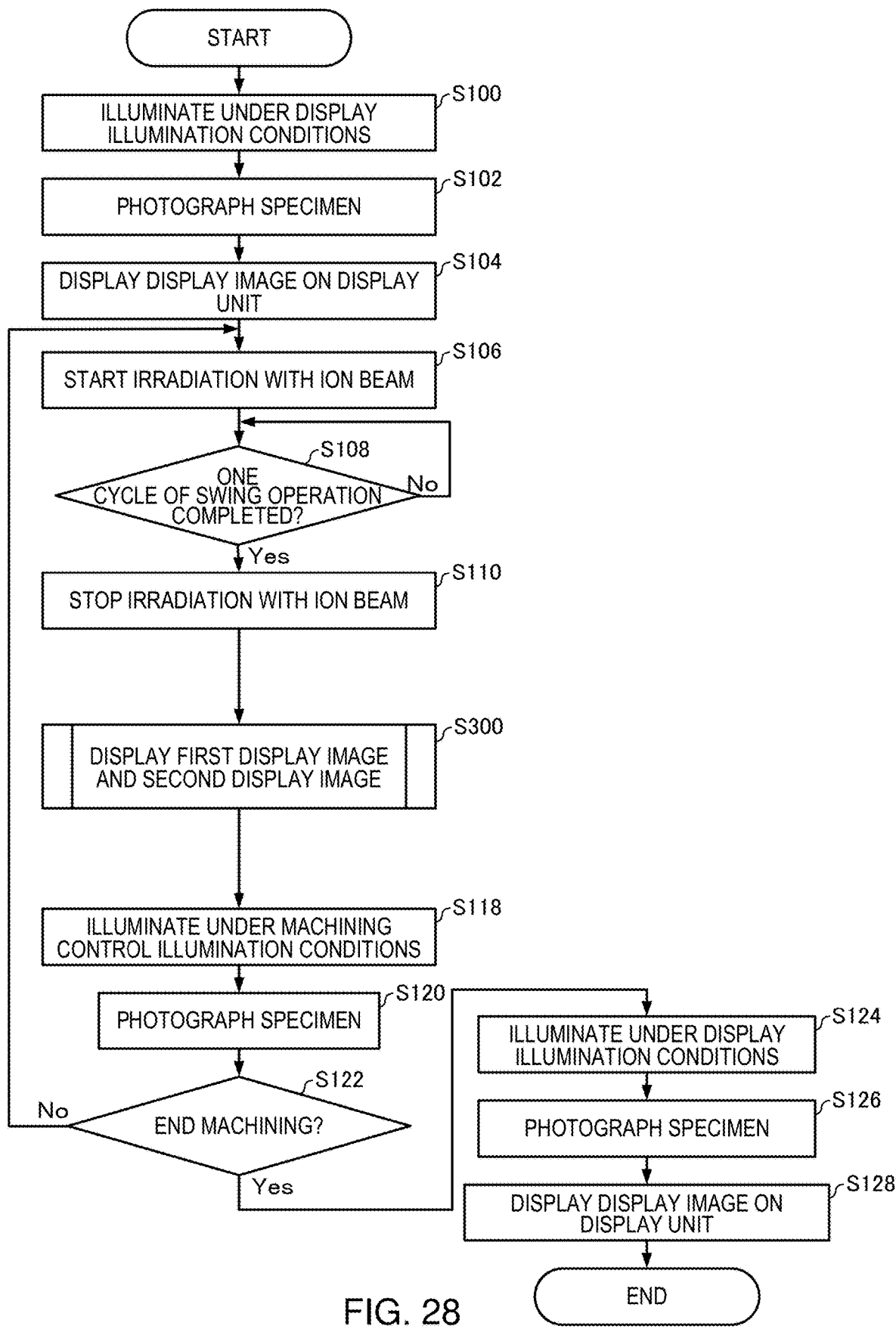
FIG. 28 is a flow chart illustrating a modification of primary milling processing.
Figure 29:
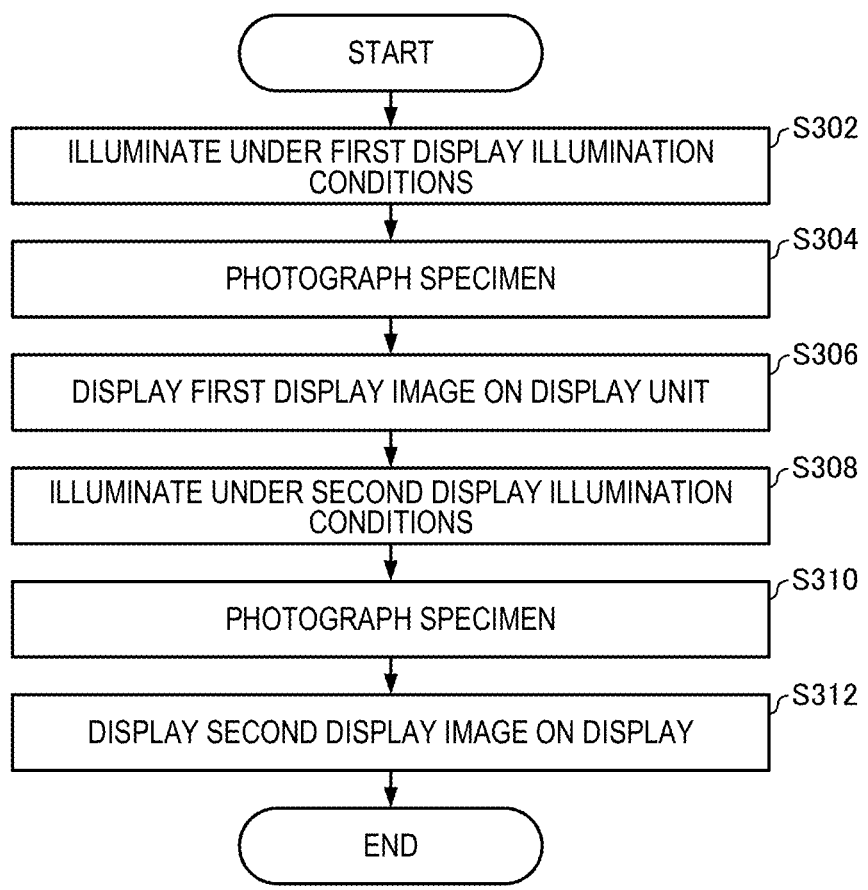
FIG. 29 is a flow chart illustrating a modification of primary milling processing.

FIG. 28 and FIG. 29 are flow charts illustrating a modification of the primary milling processing. In Modification 5, the image acquiring unit 720 performs processing S300 to display on the display unit 76 a first display image and a second display image after the processing S110 to stop emission of the ion beam IB, without performing the processing steps S112, S114 and S116, which is different from the primary milling processing described above with reference to FIG. 12.

In the processing S300, the image acquiring unit 720 controls the illumination system 40 first, as illustrated in FIG. 29, so that the specimen 2 is illuminated under the first display illumination conditions (S302). Under the first display illumination conditions, the specimen 2 is illuminated by the transmission illumination, for example. The image acquiring unit 720 controls the camera 60 and photographs the specimen 2 illuminated under the first display illumination conditions (S304), and the display control unit 724 displays the first display image on the display unit 76 (S306).

Then the image acquiring unit 720 controls the illumination system 40 so that the specimen 2 is illuminated under the second display illumination conditions (S308). Under the second display illumination conditions, the specimen 2 is illuminated by the epi-illumination, for example. The image acquiring unit 720 controls the camera 60 and photographs the specimen 2 illuminated under the second display illumination conditions (S310), and the display control unit 724 displays the second display image on the display unit 76 (S312).

By the processing unit 72 performing the processing S300, the first display image which was photographed in the transmission illumination; and the second display image which was photographed in the epi-illumination, are displayed on the display unit 76.

While the case of the primary milling processing was described above, the processing steps are the same in the case of the secondary milling processing and the bulk machining processing as well.

In this way, the processing unit 72 performs: the processing to control the illumination system 40 so that the specimen 2 is illuminated under the first display illumination conditions, the processing for the camera 60 to photograph the specimen 2 illuminated under the first display illumination conditions and acquire the first display image; the processing to display the first display image on the display unit 76; the processing to control the illumination system 40 so that the specimen is illuminated under the second display illumination conditions; the processing for the camera 60 to photograph the specimen 2 illuminated under the second display illumination conditions and acquire the second display image; and the processing to display the second display image on the display unit 76. Thereby the two display images photographed under different illumination conditions are displayed on the display unit 76, and the user can recognize the machining state of the specimen 2 more accurately.

5.6. Modification 6

Figure 30:
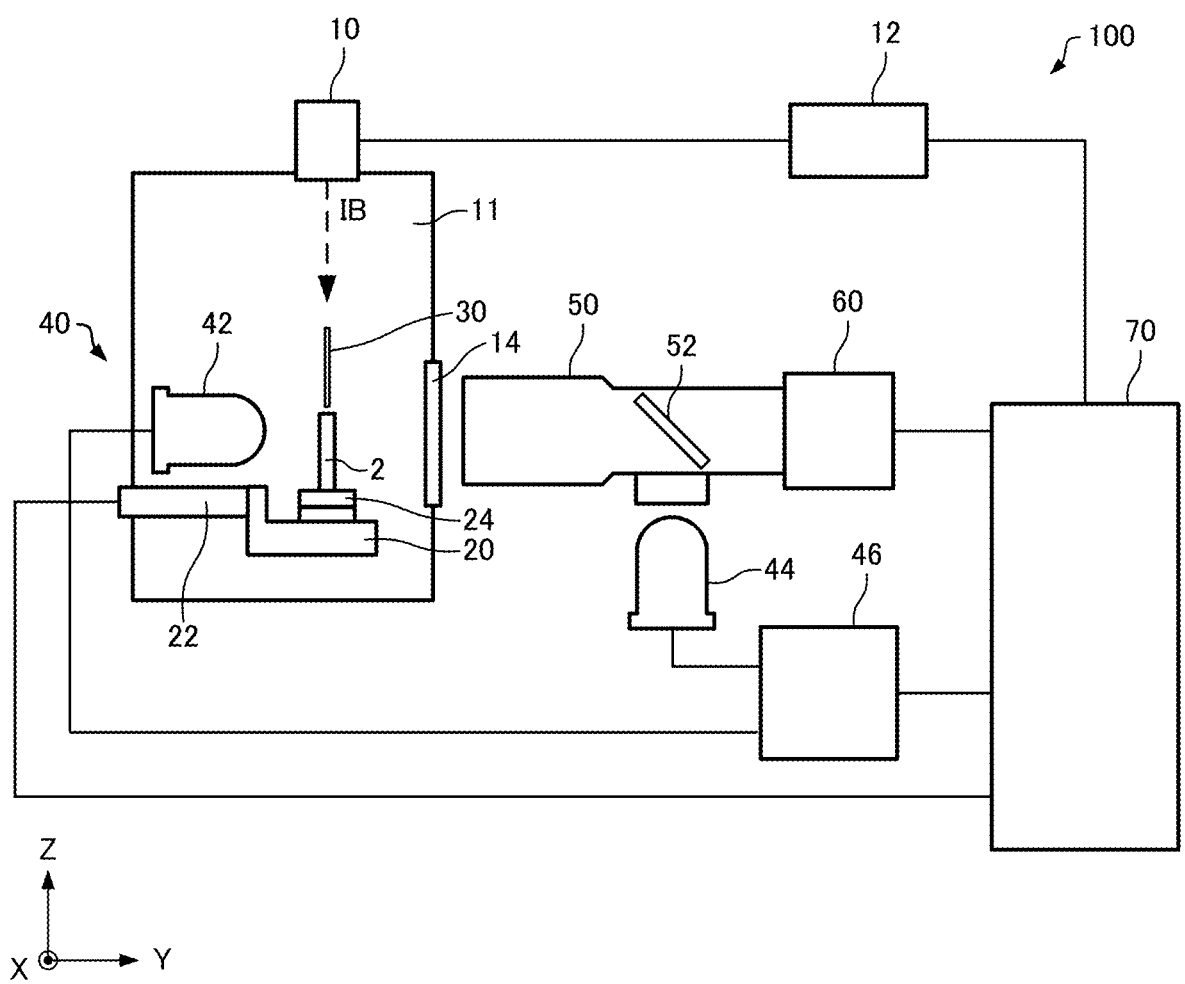
FIG. 30 is a diagram illustrating a modification of a configuration of a specimen machining device.

FIG. 30 is a diagram illustrating a modification of the configuration of the specimen machining device 100. As illustrated in FIG. 30, the specimen stage 20 includes a tilt mechanism 24 to control an incident angle of the ion beam IB with respect to the specimen 2 by tilting the specimen 2.

Figure 31:
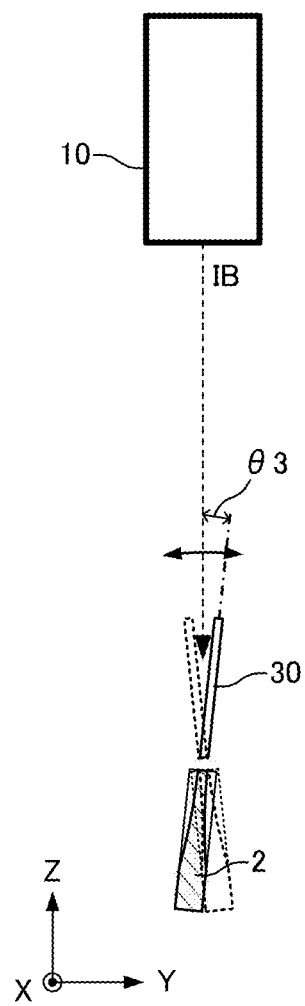
FIG. 31 is a diagram for explaining an operation of tilt mechanism.

FIG. 31 is a diagram for explaining the operation of the tilt mechanism 24.

In the example in FIG. 5 described above, the ion source 10 is oscillated, and the ion beam IB irradiates the machining surface of the specimen 2 from the diagonal direction. However, as illustrated in FIG. 31, the ion beam IB may irradiate the machining surface of the specimen 2 from the diagonal direction by oscillating the specimen 2 without oscillating the ion source 10. The tilt mechanism 24 tilts the specimen 2 with an axis parallel with the X axis as the tilt axis. The range of the tilt angle θ3 of the specimen 2 that can be tilted by the tilt mechanism 24 may be arbitrarily set in accordance with the material of the specimen 2, and the like.

When the display image is acquired, the image acquiring unit 720 acquires the display image by photographing the specimen 2, which is tilted at a first tilt angle by the tilt mechanism 24, with the camera 60, and acquires the display image by photographing the specimen 2, which is tilted at a second tilt angle that is different from the first tilt angle, with the camera 60, and the display control unit 724 displays the display image photographed at the first tilt angle and the display image photographed at the second tilt angle on the display unit 76.

Figure 32:
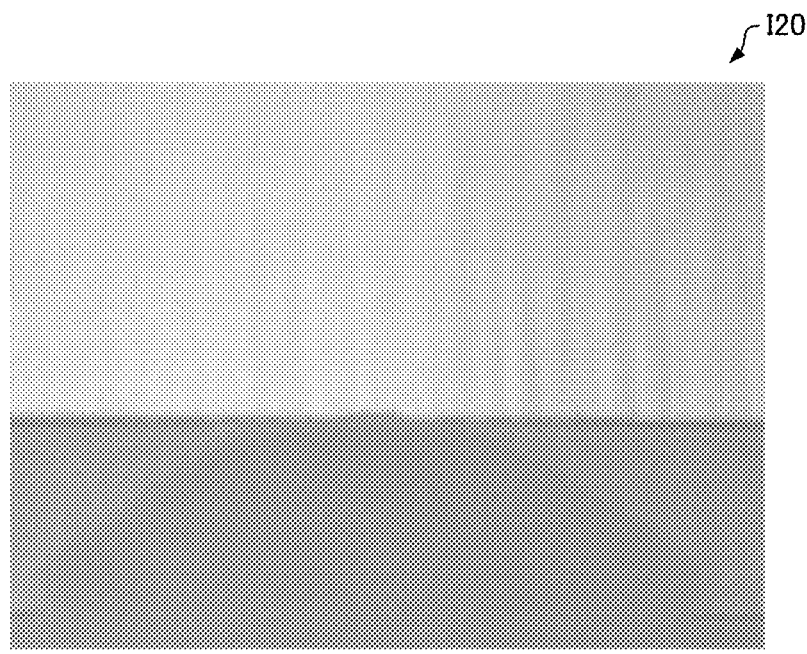
FIG. 32 is an image of a specimen photographed at tilt angle θ3=0°.
Figure 33:
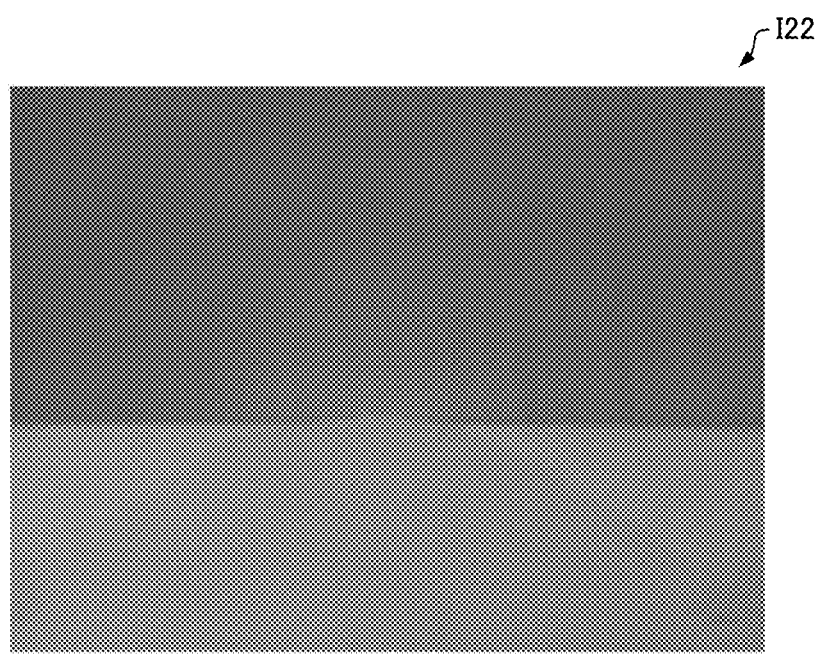
FIG. 33 is an image of a specimen photographed at tilt angle θ3=4°.

FIG. 32 is an image I20 of the specimen 2 photographed at the tilt angle θ3=0°, and FIG. 33 is an image I22 of the specimen 2 photographed at the tilt angle θ3=4°. FIG. 32 and FIG. 33 are images of the specimen 2 illuminated by the transmission illumination and the epi-illumination, photographed by the camera 60.

By changing the tilt angle θ3, the tilt angle of the specimen 2, with respect to the optical axis of the coaxial illumination device 44, can be changed. In other words, by changing the tilt angle θ3, the ratio of the epi-illumination light, that is reflected by the specimen 2 and enters the camera 60, can be changed. For example, as illustrated in FIG. 32, the ratio of the reflected light that enters the camera 60 is large in the case of the tilt angle θ3=0°, and in the case of the tilt angle θ3=4°, the ratio of the reflected light that enters the camera 60 is smaller than in the case of the tilt angle θ3=0°.

Therefore in the image I22, as illustrated in FIG. 32 and FIG. 33, the influence of the light reflected by the specimen 2 is small and the influence of the light transmitted through the specimen 2 is large, compared with the image I20. Hence in the image I20, the multi-layered film 6 between the substrate 4 and the protective member 8 (glass) can be observed. Further, in the image I22, the state of the periphery of the multi-layered film 6 that is thinned can be observed.

By capturing the image of the specimen 2 with changing the tilt angle θ3 like this, information that can be acquired from the image changes. Hence the machining state of the specimen 2 can be more accurately recognized by capturing images of the specimen 2 with changing the tilt angle θ3.

5.7. Modification 7

Figure 34:
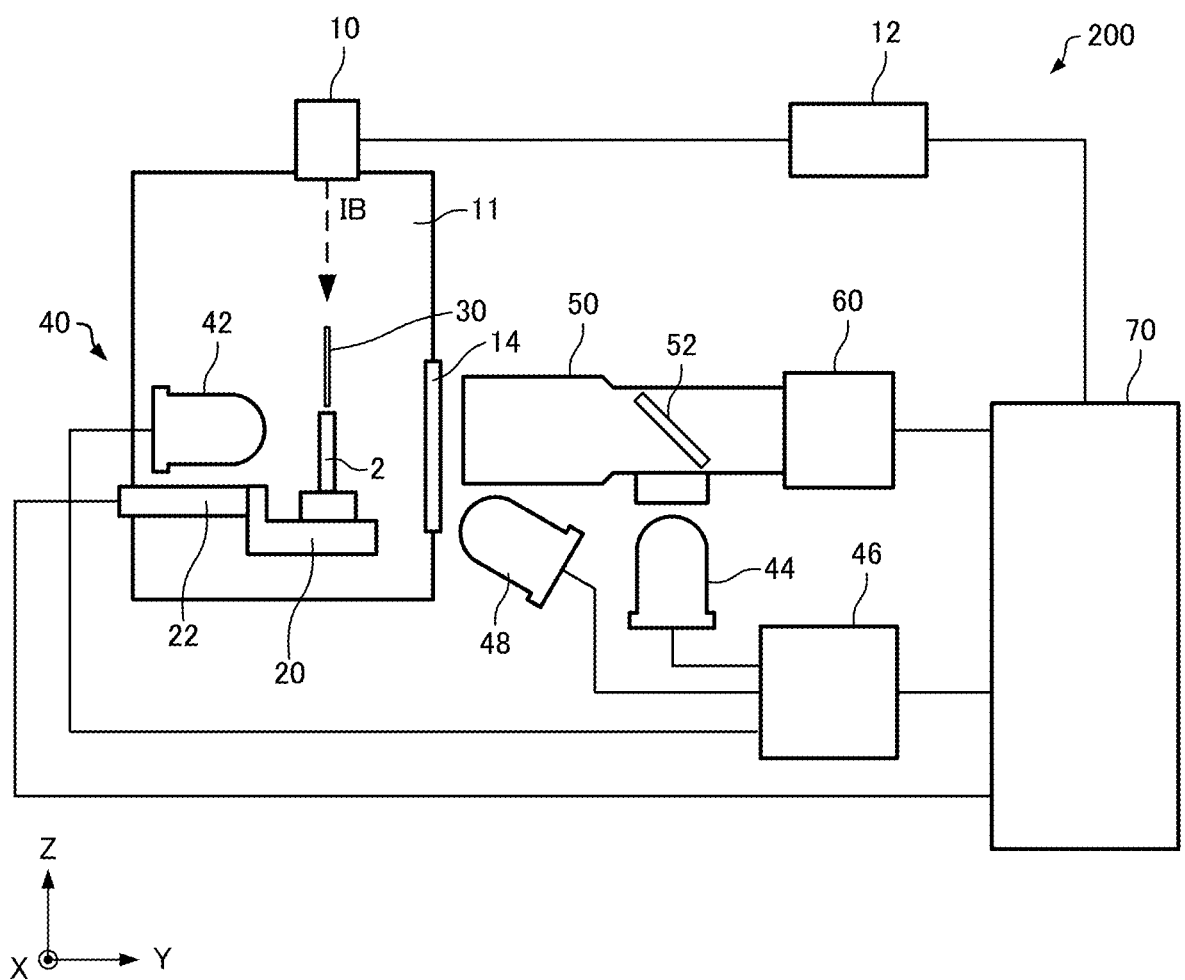
FIG. 34 is a diagram illustrating a modification of a configuration of a specimen machining device.

FIG. 34 is a diagram illustrating the configuration of a specimen machining device 200 according to Modification 7. In the specimen machining device 200, a composing element having the same function as a composing element of the above mentioned specimen machining device 100 is denoted with the same reference number, and detailed description thereof will be omitted.

As illustrated in FIG. 34, the illumination system 40 of the specimen machining device 200 includes a side illumination device 48. In other words, the illumination system 40 includes the transmission illumination device 42 which performs the transmissions illumination on the specimen 2, the coaxial illumination device 44 which performs the coaxial illumination on the specimen 2, and the side illumination device 48 which performs the side illumination on the specimen 2. In this way, the illumination system 40 includes the three illumination devices which illuminate the specimen 2 from mutually different directions.

The side illumination device 48 emits the illumination light to perform the side illumination on the specimen 2. In the side illumination, light is emitted onto the specimen 2 diagonally from the side of the camera 60. If the specimen 2 is illuminated by the side illumination, a shadow is generated by irregularities on the surface of the specimen 2, hence the contours of the specimen 2 can be clearly recognized and a three-dimensional image can be acquired.

For the display illumination conditions, various illumination conditions can be set, such as: the illumination conditions using the side illumination; the illumination conditions using the side illumination and the coaxial illumination; and the illumination conditions using the side illumination and the transmission illumination.

The operation of the specimen machining device 200 is the same as the specimen machining device 100 described above, hence description thereof will be omitted.

5.8. Modification 8

In the embodiments described above, the end of machining is determined based on the machining control image, but the irradiation conditions of the ion beam IB may be changed based on the machining control image. For example, the energy (acceleration voltage) of the ion beam IB may be changed based on the machining control image. Specifically, the machining control unit 722 may determine the state of machining of the specimen 2 based on the machining control image, and decrease the energy (acceleration voltage) of the ion beam IB as the machining progresses.

5.9. Modification 9

The embodiments and the modifications described above are examples, and the invention is not limited to these. For example, each embodiment and each modification may be combined as necessary.

The invention is not limited to the above-described embodiments, and various modifications can be made. For example, the invention includes configurations that are substantially the same as the configurations described in the embodiments. Substantially same configurations mean configurations having the same functions, methods and results, or configurations having the same objectives and effects as those of the configurations described in the embodiments, for example. The invention also includes configurations obtained by replacing non-essential elements of the configurations described in the embodiments with other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

Some embodiments of the invention have been described in detail above, but a person skilled in the art will readily appreciate that various modifications can be made from the embodiments without materially departing from the novel teachings and effects of the invention. Accordingly, all such modifications are assumed to be included in the scope of the invention.

What is claimed is:

1. A specimen machining device for machining a specimen by irradiating the specimen with an ion beam, the device comprising:
   an ion source that irradiates the specimen with the ion beam;
   a specimen stage that holds the specimen;
   an illumination system that illuminates the specimen under a machine control illumination condition and under a display illumination condition that is different from the machining control illumination condition;
   a camera that photographs the specimen;
   a display unit on which an image of the specimen photographed by the camera is displayed; and
   a processing unit that controls the illumination system and the camera, and acquires a machining control image that is used for controlling the ion source and a display image that is displayed on the display unit,
   the processing unit performing processing for:
   controlling the illumination system to illuminate the specimen under the machining control illumination condition;
   acquiring the machining control image by controlling the camera to photograph the specimen illuminated under the machining control illumination condition;
   controlling the ion source based on the machining control image;
   controlling the illumination system to illuminate the specimen under the display illumination condition that is different from the machining control illumination condition;
   acquiring the display image by controlling the camera to photograph the specimen illuminated under the display illumination condition;
   displaying the display image on the display unit; and
   repeating processing for acquiring the machining control image,
   wherein the processing unit further performs processing for:
   detecting a region of which change is large from among repeatedly acquired machining control images, and
   magnifying a region of the display image positionally corresponding to the detected region of which change is large, and displaying the magnified image on the display unit.

2. The specimen machining device according to claim 1, wherein
   the processing unit performs processing for:
   receiving an instruction to change the display illumination condition;
   changing the display illumination condition based on the instruction to change the display illumination condition, and
   controlling the illumination system to illuminate the specimen under the changed display illumination condition.

3. The specimen machining device according to claim 1, wherein
the processing unit performs processing for:
receiving an instruction to change magnification of the display image displayed on the display unit; and
changing the magnification of the display image and displaying the display image on the display unit, based on the instruction to change the magnification of the display image.

4. The specimen machining device according to claim 1, wherein
the processing unit performs processing for:
receiving an instruction to change a field-of-view of the display image displayed on the display unit; and
changing the field-of-view of the display image and displaying the display image on the display unit, based on the instruction to change the field-of-view of the display image.

5. The specimen machining device according to claim 1, wherein
the processing unit performs processing for controlling the ion source to stop irradiation with the ion beam before controlling the camera to photograph the specimen illuminated under the display illumination condition.

6. The specimen machining device according to claim 1, wherein
the processing unit performs processing for:
controlling the illumination system to illuminate the specimen under a first display illumination condition;
acquiring a first display image by controlling the camera to photograph the specimen illuminated under the first display illumination condition;
displaying the first display image on the display unit;
controlling the illumination system to illuminate the specimen under a second display illumination condition;
acquiring a second display image by controlling the camera to photograph the specimen illuminated under the second display illumination condition; and
displaying the second display image on the display unit.

7. The specimen machining device according to claim 1, wherein the illumination system comprises:
a first illumination device that is a transmission illumination device that performs transmission-illumination on the specimen, and
a second illumination device that is a coaxial illumination device that performs coaxial illumination on the specimen.

8. The specimen machining device according to claim 7, wherein
the illumination system includes a third illumination device that illuminates the specimen from a direction that is different from the directions from which the first and second illumination devices illuminate the specimen, and
the third illumination device is a side-illumination device that performs side-illumination on the specimen.

9. The specimen machining device according to claim 7, wherein
the specimen stage tilts the specimen by using an axis that is orthogonal to an optical axis of the coaxial illumination device, as a tilt axis, and
the processing unit performs processing for:
acquiring the display image by controlling the camera to photograph the specimen tilted at a first tilt angle;
acquiring the display image by controlling the camera to photograph the specimen tilted at a second tilt angle that is different from the first tilt angle; and
displaying the display image of the specimen tilted at the first tilt angle and the display image of the specimen tilted at the second tilt angle on the display unit.

10. The specimen machining device according to claim 1, wherein
the specimen stage comprises a swing mechanism that oscillates the specimen;
the ion source is configured to be oscillated;
the processing unit performing processing for:
irradiating the specimen with the ion beam from the ion source;
oscillating the specimen by the swing mechanism;
oscillating the ion source; and
stopping irradiation with the ion beam, the oscillating of the specimen by the swing mechanism, and the oscillating of the ion source when it is determined that the swing mechanism completed one cycle of operation.

11. The specimen machining device according to claim 10, wherein
the processing unit performing processing for stopping irradiation with the ion beam, the oscillating of the specimen by the swing mechanism, and the oscillating of the ion source before an image of the specimen illuminated under the display illumination condition is photographed by the camera.

12. A specimen machining method using a specimen machining device that comprises an ion source for irradiating a specimen with an ion beam, and an illumination system that illuminates the specimen under a machine control illumination condition and under a display illumination condition that is different from the machining control illumination condition, and machines the specimen by irradiating the specimen with the ion beam, the method comprising:
controlling the illumination system to illuminate the specimen under the machining control illumination condition;
acquiring a machining control image by photographing the specimen illuminated under the machining control illumination condition with a camera;
controlling the ion source based on the machining control image;
controlling the illumination system to illuminate the specimen under the display illumination condition that is different from the machining control illumination condition;
acquiring a display image by photographing the specimen illuminated under the display illumination condition with the camera;
displaying the display image on a display unit;
repeating processing for acquiring the machining control image;
detecting a region of which change is large from among repeatedly acquired machining control images; and
magnifying a region of the display image positionally corresponding to the detected region of which change is large, and displaying the magnified image on the display unit.

13. The specimen machining method according to claim 12, the method comprising:
machining the specimen by irradiating the specimen with the ion beam from a first edge side of the specimen; and machining the specimen by irradiating the specimen with the ion beam from a second edge side on the side opposite to the first edge of the specimen.

14. The specimen machining method according to claim 12, the method comprising:

irradiating the specimen with the ion beam, while the ion source is oscillated and the specimen is oscillated by a swing mechanism; and stopping irradiation with the ion beam, the oscillating of the specimen by the swing mechanism, and the oscillating of the ion source when the swing mechanism completed one cycle of operation.

15. The specimen machining method according to claim 14, wherein:

irradiation with the ion beam, the oscillating of the specimen by the swing mechanism, and the oscillating of the ion source are stopped before photographing an image of the specimen illuminated under the display illumination condition by the camera.

\* \* \* \* \*